(12) United States Patent
Tajima et al.

(10) Patent No.: US 12,512,819 B2
(45) Date of Patent: Dec. 30, 2025

(54) TOPOLOGIES FOR ACOUSTIC-WAVE RECEIVE-SIDE FILTERS

(71) Applicant: SKYWORKS SOLUTIONS, INC., Irvine, CA (US)

(72) Inventors: Motoyuki Tajima, Yokohama (JP); Yiliu Wang, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 435 days.

(21) Appl. No.: 18/156,578

(22) Filed: Jan. 19, 2023

(65) Prior Publication Data
US 2023/0238940 A1    Jul. 27, 2023

Related U.S. Application Data

(60) Provisional application No. 63/303,093, filed on Jan. 26, 2022, provisional application No. 63/303,095, filed on Jan. 26, 2022.

(51) Int. Cl.
| | |
|---|---|
| *H03H 9/64* | (2006.01) |
| *H03H 9/25* | (2006.01) |
| *H03H 9/72* | (2006.01) |
| *H04B 1/00* | (2006.01) |

(52) U.S. Cl.
CPC ............ *H03H 9/6483* (2013.01); *H03H 9/25* (2013.01); *H03H 9/6433* (2013.01); *H03H 9/725* (2013.01); *H04B 1/0057* (2013.01)

(58) Field of Classification Search
CPC ...... H03H 9/6483; H03H 9/25; H03H 9/6433; H03H 9/725; H03H 9/605; H03H 9/6476; H03H 9/706

USPC .................................................. 333/186–193
See application file for complete search history.

(56) References Cited

U.S. PATENT DOCUMENTS

| | | | |
|---|---|---|---|
| 10,097,159 B2 | 10/2018 | Komatsu et al. | |
| 10,367,475 B2 | 7/2019 | Caron | |
| 2015/0180450 A1 | 6/2015 | Yamaji et al. | |
| 2017/0026074 A1 | 1/2017 | King et al. | |
| 2017/0331457 A1* | 11/2017 | Satoh ..................... | H10N 30/40 |
| 2018/0152191 A1 | 5/2018 | Niwa et al. | |
| 2019/0319606 A1 | 10/2019 | Ando et al. | |
| 2022/0149815 A1 | 5/2022 | Schulz et al. | |
| 2023/0238984 A1 | 7/2023 | Tajima et al. | |

* cited by examiner

*Primary Examiner* — Rakesh B Patel
(74) *Attorney, Agent, or Firm* — Lando & Anastasi, LLP

(57) ABSTRACT

An antenna multiplexer comprising an input port for receiving a transmission signal, a common port, an output port, a transmit filter coupled between the input port and the common port, and a receive filter coupled between the common port and the output port. The receive filter includes a first plurality of acoustic wave resonators in a series path between the common port and the output port and a second plurality of acoustic wave resonators each coupled between the series path and ground. None of the second plurality of acoustic wave resonators are coupled to the output port. The first plurality of acoustic wave resonators including a compensation resonator that is coupled to the output port and has a capacitance that is less than an average of the capacitances of the first plurality of acoustic wave resonators. A module comprising the antenna multiplexer. An electronic device comprising the antenna multiplexer.

20 Claims, 15 Drawing Sheets

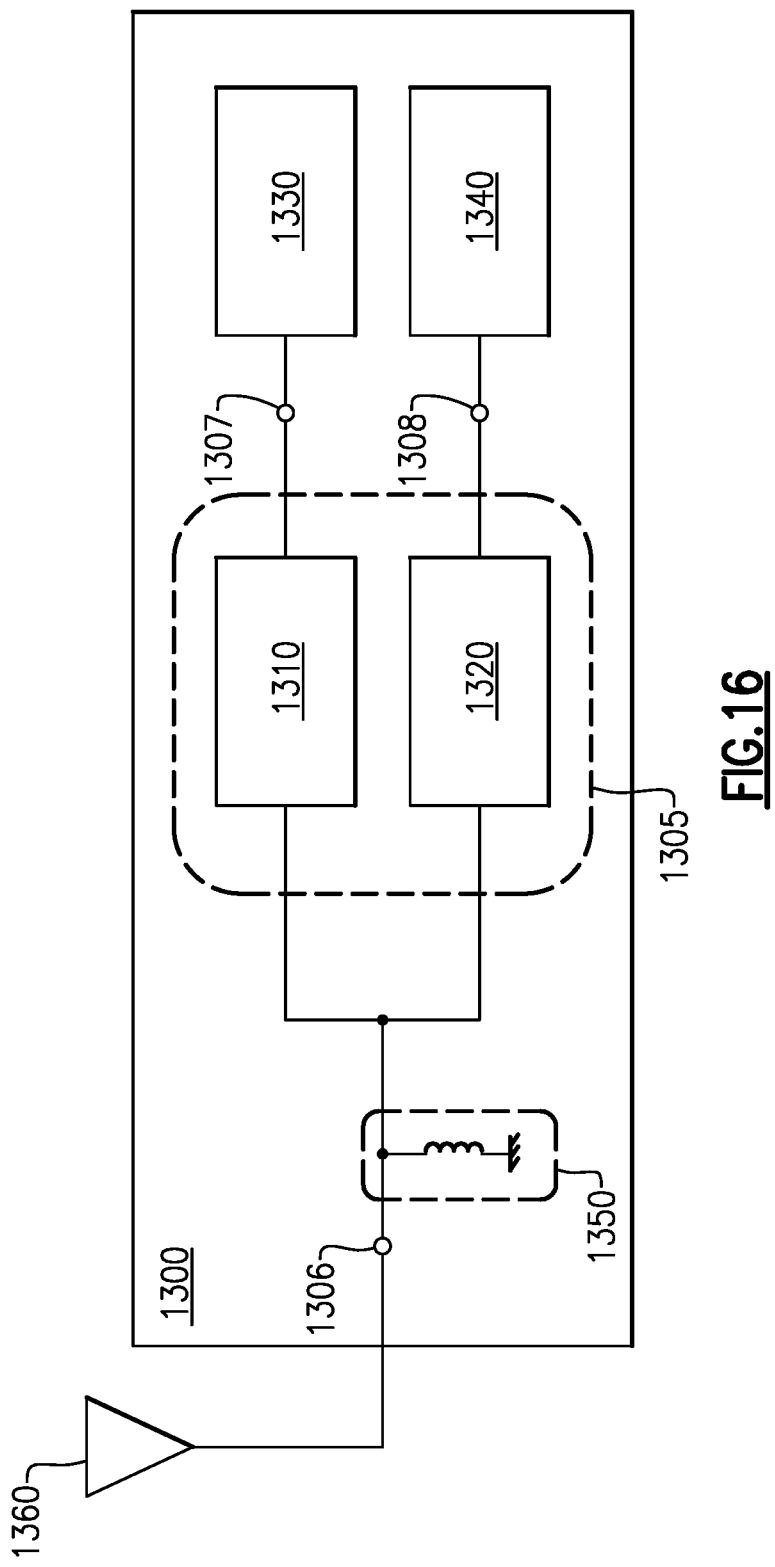

TOPOLOGIES FOR ACOUSTIC-WAVE RECEIVE-SIDE FILTERS

CROSS-REFERENCE TO RELATED APPLICATIONS

This application claims priority under 35 U.S.C. § 119(e) to U.S. Provisional Patent Application Ser. No. 63/303,095, titled "ACOUSTIC-WAVE RECEIVE-SIDE FILTER TOPOLOGIES," filed Jan. 26, 2022 and to U.S. Provisional Patent Application Ser. No. 63/303,093, titled "ACOUSTIC-WAVE RECEIVE-SIDE FILTER TOPOLOGIES," filed Jan. 26, 2022, the subject matter of each being incorporated herein by reference in its entirety for all purposes.

BACKGROUND

Field

Aspects and embodiments disclosed herein relate to filter topologies for receive-side filters in multiplexers such as diplexers.

Description of the Related Technology

An acoustic wave filter can include a plurality of resonators arranged to filter a radio frequency signal. Example acoustic wave filters include surface acoustic wave (SAW) filters and bulk acoustic wave (BAW) filters. A film bulk acoustic resonator (FBAR) filter is an example of a BAW filter. An acoustic wave filter can be arranged to filter a radio frequency (RF) signal.

Acoustic wave filters can be implemented in radio frequency (RF) electronic systems, such as mobile phones, tablets, base stations, network access points, customer-premises equipment (CPE), laptops, and wearable electronics.

An acoustic wave filter can be included as a receive-side filter in a diplexer or multiplexer.

SUMMARY

According to a first aspect there is provided a circuit. The circuit comprises a receive block that includes a low noise amplifier configured to amplify a received signal, a transmit block configured to output a transmission signal in a transmission frequency band, an antenna multiplexer including an input port coupled to the transmit block to receive the transmission signal from the transmit block, an output port coupled to the receive block to provide the received signal to an input of the low noise amplifier, a common port for coupling to an antenna, a transmit filter coupled between the input port and the common port, and a receive filter coupled between the common port and the output port, the receive filter including a first plurality of acoustic wave resonators coupled together in series between the common port and the output port, the receive filter further including a second plurality of acoustic wave resonators, each of the second plurality of acoustic wave resonators coupled between ground and a respective node between a pair of acoustic wave resonators of the first plurality of acoustic wave resonators, the first plurality of acoustic wave resonators including a compensation resonator coupled directly to the output port, a first angular range that is equal to the angular range of a reflection coefficient of the antenna multiplexer over the transmission frequency band measured looking into the output port of the antenna multiplexer, and a second angular range that does not overlap with the first angular range, the second angular range equal to the angular range of the conjugate of the reflection coefficient of the low noise amplifier over the transmission frequency band measured looking into an input of the low noise amplifier.

In accordance with another aspect there is provided a module. The module comprises a receive block that includes a low noise amplifier configured to amplify a received signal, a transmit block configured to output a transmission signal in a transmission frequency band, an antenna multiplexer including an input port coupled to the transmit block to receive the transmission signal from the transmit block, an output port coupled to the receive block to provide the received signal to an input of the low noise amplifier, a common port for coupling to an antenna, a transmit filter coupled between the input port and the common port, and a receive filter coupled between the common port and the output port, the receive filter including a first plurality of acoustic wave resonators coupled together in series between the common port and the output port, the receive filter further including a second plurality of acoustic wave resonators, each of the second plurality of acoustic wave resonators coupled between ground and a respective node between a pair of acoustic wave resonators of the first plurality of acoustic wave resonators, the first plurality of acoustic wave resonators including a compensation resonator coupled directly to the output port, a first angular range that is equal to the angular range of a reflection coefficient of the antenna multiplexer over the transmission frequency band measured looking into the output port of the antenna multiplexer, and a second angular range that does not overlap with the first angular range, the second angular range equal to the angular range of the conjugate of the reflection coefficient of the low noise amplifier over the transmission frequency band measured looking into an input of the low noise amplifier.

In accordance with another aspect there is provided an electronic device. The electronic device comprises a receive block that includes a low noise amplifier configured to amplify a received signal, a transmit block configured to output a transmission signal in a transmission frequency band, an antenna multiplexer including: an input port coupled to the transmit block to receive the transmission signal from the transmit block, an output port coupled to the receive block to provide the received signal to an input of the low noise amplifier, a common port for coupling to an antenna, a transmit filter coupled between the input port and the common port, and a receive filter coupled between the common port and the output port, the receive filter including a first plurality of acoustic wave resonators coupled together in series between the common port and the output port, the receive filter further including a second plurality of acoustic wave resonators, each of the second plurality of acoustic wave resonators coupled between ground and a respective node between a pair of acoustic wave resonators of the first plurality of acoustic wave resonators, the first plurality of acoustic wave resonators including a compensation resonator coupled directly to the output port, a first angular range that is equal to the angular range of a reflection coefficient of the antenna multiplexer over the transmission frequency band measured looking into the output port of the antenna multiplexer, and a second angular range that does not overlap with the first angular range, the second angular range equal to the angular range of the conjugate of the reflection coefficient of the low noise amplifier over the transmission frequency band measured looking into an input of the low noise amplifier.

In some examples of the above-described circuits, modules and electronic devices, the first angular range and the second angular range are separated by a separation angle. The separation angle is an angle within one of the following ranges: 0 to 45 degrees, 0 to 30 degrees, 0 to 20 degrees, 1 to 20 degrees, 5 to 20 degrees, 10 to 20 degrees, 2 to 15 degrees, 3 to 15 degrees, 5 to 15 degrees, 10 to 15 degrees, 2 to 10 degrees, 3 to 10 degrees, 5 to 10 degrees, 2 to 8 degrees, or 3 to 8 degrees.

The compensation resonator may have a first end and a second end, the first end coupled to the output port of the antenna multiplexer, the second end coupled to another of the first plurality of acoustic wave resonators, the circuit, module or electronic device having a third angular range that does overlap with the second angular range, the third angular range equal to the angular range of a reflection coefficient of the antenna multiplexer over the transmission frequency band measured at the second end of the compensation resonator looking into the antenna multiplexer toward the input port.

The compensation resonator may have a capacitance that is relatively small compared with capacitances of some other resonators in the antenna multiplexer. A capacitance of a resonator may depend on a characteristic size of the resonator. For a surface acoustic wave (SAW) resonator, the characteristic size of the resonator may include a number of IDT (interdigital transducer) electrode fingers multiplied by an IDT aperture. For a bulk acoustic wave (BAW) resonator, the characteristic size may be an area of overlap of top and bottom electrodes in the BAW resonator. The smaller the capacitance (or size) of the compensation resonator, the greater the angular shift effect of the compensation resonator, which may result in a greater improvement to isolation performance at transmission frequencies. The capacitance of the compensation resonator may be one or more of: i) smaller than an average of the capacitances of the first plurality of acoustic wave resonators; ii) smaller than an average of the capacitances of the first plurality of acoustic wave resonators and the capacitances of the second plurality of acoustic wave resonators; or iii) smaller than an average of the capacitances of all of the acoustic wave resonators in the receive filter of the antenna multiplexer. The capacitance of the compensation resonator may be smaller than some fraction of one of the above-described average capacitances. The fraction may be 10%, 20%, 30%, 40%, 50%, 60%, 70%, 80%, or 90%. For example, the capacitance of the compensation resonator may be smaller than 10%, 20%, 30%, 40%, 50%, 60%, 70%, 80%, or 90% of the average of the capacitances of the resonators of the first plurality of resonators. To determine the average capacitance to characterize the relatively small capacitance of the compensation resonator, one of the following averages can be determined: an arithmetic mean, a geometric mean, or a median. The capacitance of the compensation resonator may be a smallest capacitance of the capacitances of the first plurality of acoustic wave resonators, a smallest capacitance of the capacitances of the first and second pluralities of acoustic wave resonators, or a smallest capacitance of the capacitances of all acoustic wave resonators in the receive filter.

In some embodiments, none of the second plurality of acoustic wave resonators may be coupled directly to the output port. There may optionally be no shunt acoustic wave resonators coupled between the output port and ground. There may optionally be a node between each pair of neighboring acoustic wave resonators of the first plurality of acoustic wave resonators and receive filter may optionally further include one or more additional acoustic wave resonators in one or more respective loop paths, each of the one or more respective loop paths coupled between two of the nodes, between one of the nodes and either the output port or common port, or between the output port and the common port.

One or both of the first and second pluralities of acoustic wave resonators may include one or more of a surface acoustic wave (SAW) resonator, a temperature compensated SAW resonator, a solidly mounted resonator (SMR), a bulk acoustic wave (BAW) resonator, a film bulk acoustic resonator (FBAR), a Lamb wave resonator (LWR), a multilayer piezoelectric substrate (MPS), or a double mode SAW (DMS) filter. A temperature compensated SAW resonator may include, for example, a lithium niobate, lithium tantalate, or quartz substrate with one or more layers of silicon, glass (silicon dioxide), spinel, and/or sapphire. Each of the first and second pluralities of acoustic wave resonators may include resonators of a single type or of a plurality of different types including any of the above-mentioned types.

The receive filter may be a band pass filter or a band rejection filter.

The transmission frequency band may be an uplink portion of a Long Term Evolution frequency band, such as one of the following LTE frequency bands: B2, B3, B7, B25, or B26.

The antenna multiplexer may be a diplexer.

The antenna port of the antenna multiplexer may be coupled to an antenna.

One or more of the second plurality of acoustic wave resonators may be coupled to ground via one or more inductors.

The first plurality of acoustic wave resonators may comprise three, four, five, six, seven, eight, nine, ten, or more acoustic wave resonators in series.

The second plurality of acoustic wave resonators may comprise two, three, four, five, six, seven, eight, nine, ten, or more acoustic wave resonators in shunt configurations.

According to another aspect there is provided an antenna multiplexer. The antenna multiplexer comprises an input port for receiving a transmission signal, a common port, an output port, a transmit filter coupled between the input port and the common port, and a receive filter coupled between the common port and the output port, the receive filter including a first plurality of acoustic wave resonators in a series path between the common port and the output port and a second plurality of acoustic wave resonators that are each coupled between the series path and ground, none of the second plurality of acoustic wave resonators being coupled to the output port, the first plurality of acoustic wave resonators including a compensation resonator that is coupled to the output port and has a capacitance that is relatively small compared with capacitances of other acoustic resonators of the receive filter.

According to further aspects a module or electronic device may comprise the antenna multiplexer.

In some examples of the above-described antenna multiplexers, modules and electronic devices, the capacitance of the compensation resonator may be one or more of: i) smaller than an average of the capacitances of the first plurality of acoustic wave resonators; ii) smaller than an average of the capacitances of the first plurality of acoustic wave resonators and the capacitances of the second plurality of acoustic wave resonators; or iii) smaller than an average of the capacitances of all of the acoustic wave resonators in the receive filter of the antenna multiplexer. The capacitance of the compensation resonator may be smaller than some fraction of one of the above-described average capacitances, wherein the fraction may be 10%, 20%, 30%, 40%, 50%, 60%, 70%, 80%, or 90%. For example, the capacitance of the compensation resonator may be smaller than 10%, 20%, 30%, 40%, 50%, 60%, 70%, 80%, or 90% of the average of the capacitances of the resonators of the first plurality of resonators. To determine the average capacitance to characterize the relatively small capacitance of the compensation resonator, one of the following averages can be determined: an arithmetic mean, a geometric mean, or a median. The capacitance of the compensation resonator may be a smallest capacitance of the capacitances of the first plurality of acoustic wave resonators, a smallest capacitance of the capacitances of the first and second pluralities of acoustic wave resonators, or a smallest capacitance of the capacitances of all acoustic wave resonators in the receive filter.

There may be a node between each pair of neighboring acoustic wave resonators of the first plurality of acoustic wave resonators and the receive filter may further include one or more additional acoustic wave resonators in one or more respective loop paths, each of the one or more respective loop paths coupled between two of the nodes, between one of the nodes and either the output port or common port, or between the output port and the common port.

One or both of the first and second pluralities of acoustic wave resonators may include one or more of a surface acoustic wave (SAW) resonator, a temperature compensated SAW resonator, a solidly mounted resonator (SMR), a bulk acoustic wave (BAW) resonator, a film bulk acoustic resonator (FBAR), a Lamb wave resonator (LWR), a multilayer piezoelectric substrate (MPS), and a double mode SAW (DMS) filter. A temperature compensated SAW resonator may include, for example, a lithium niobate, lithium tantalate, or quartz substrate with one or more layers of silicon, glass (silicon dioxide), spinel, and/or sapphire. Each of the first and second pluralities of acoustic wave resonators may include resonators of a single type or of a plurality of different types including any of the above-mentioned types.

The receive filter may include a band pass filter or a band rejection filter.

The antenna multiplexer may be a diplexer.

Optionally, none of the second plurality of acoustic wave resonators, are directly coupled to the common port.

One or more of the second plurality of acoustic wave resonators may be coupled to ground via one or more inductors.

A transmit block may be coupled to the input port. The transmit block may optionally include a power amplifier.

A receive block may be coupled to the output port. The receive block may optionally include a low noise amplifier.

An antenna may be coupled to the common port.

In some embodiments, all of the acoustic wave resonators in the receive filter that are in arranged in a shunt configuration between the series path from common port to output port and ground connect to the series path at a node between the common port and the input side of the compensation resonator.

One or more of the second plurality of acoustic wave resonators may be coupled to ground via one or more inductors.

In some embodiments, all of the acoustic wave resonators in the receive filter that are in arranged in a shunt configuration between the series path from common port to output port and ground connect to the series path at a node between the common port and the input side of the compensation resonator.

The first plurality of acoustic wave resonators may comprise three, four, five, six, seven, eight, nine, ten, or more acoustic wave resonators in series.

The second plurality of acoustic wave resonators may comprise two, three, four, five, six, seven, eight, nine, ten, or more acoustic wave resonators in shunt configurations.

Aspects, embodiments, and examples disclosed herein may include any combination of some or all of the above-described features; the above-described features are not exclusive alternatives.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 16 is a schematic diagram of a front-end module in accordance with aspects and embodiments disclosed herein.

DETAILED DESCRIPTION

Figure 1:
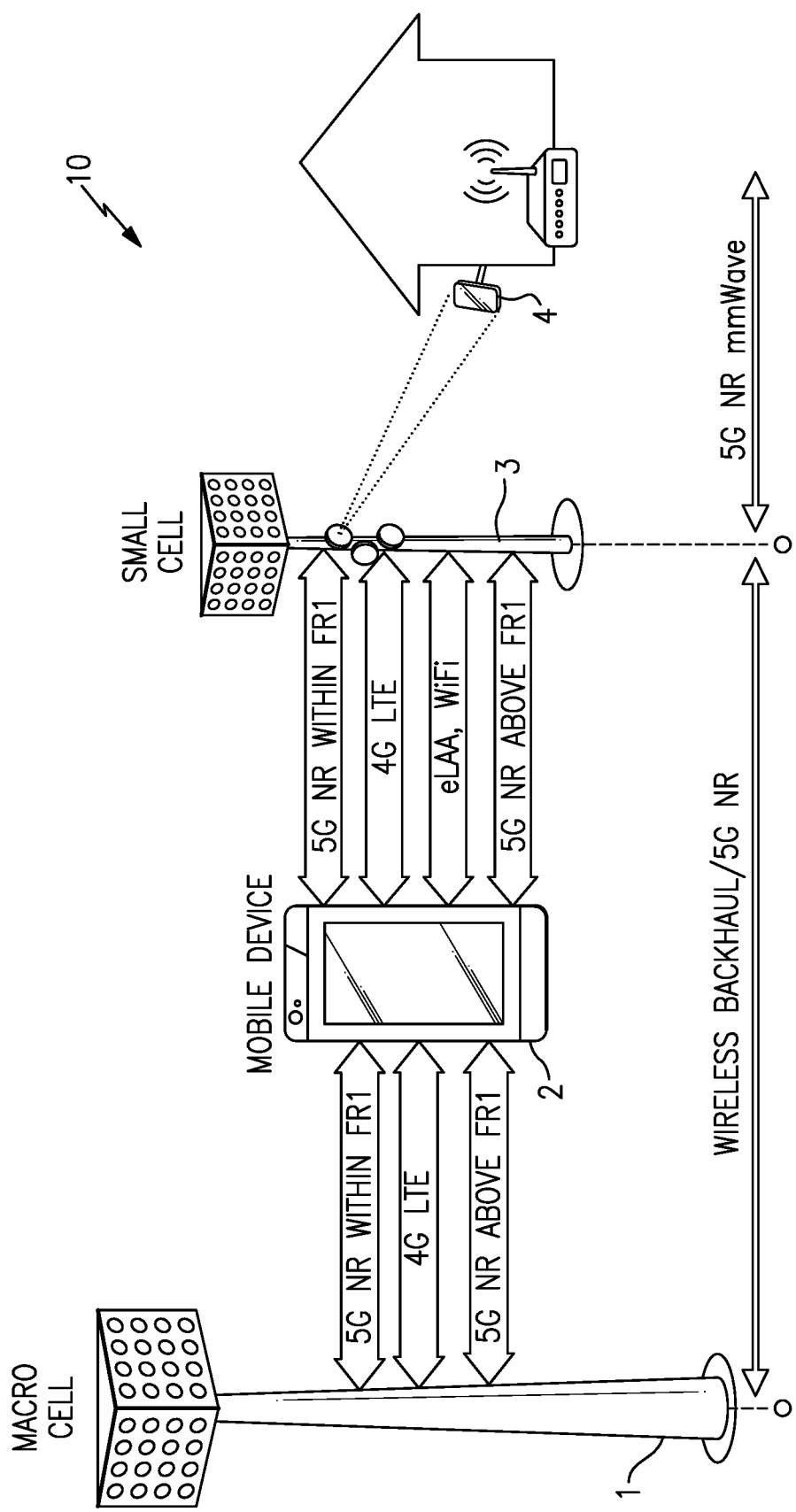
FIG. 1 is a schematic diagram of one example of a communication network.

Aspects and embodiments described herein are directed to circuits, modules and electronic devices including an antenna multiplexer in which a receive-side filter of the antenna includes multiple series acoustic wave resonators in series between a common port and an output port and also includes multiple shunt acoustic wave resonators along series path. The final series acoustic wave resonator in the series path is coupled to the output port. The presence of the final series acoustic wave resonator in this configuration may effect an angular shift in a contour of the reflection coefficient looking into the output port of the antenna multiplexer over a transmission frequency range such that improved isolation is provided between input port and any low noise amplifier (LNA) coupled to the output port over the frequency range of the transmission signal. A compensation resonator having a smaller capacitance may have a greater angular shift than one having a larger capacitance and so implementations may select a size or capacitance of compensation resonator accordingly. For example, implementations may select a size or capacitance of compensation resonator such that the contour of the reflection coefficient looking into the output port of the antenna multiplexer over the transmission frequency range does not overlap with a contour of the reflection coefficient of the LNA input conjugate over the same frequency range. Therefore, a compensation resonator may have a relatively small capacitance compared with capacitances of other acoustic wave resonators of the receive filter.

While aspects and embodiments are described herein mainly in the context of a diplexer, it will be recognized that the aspects and embodiments disclosed herein may be implemented in other multiplexers including, for example, a triplexer.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and is currently in the process of developing Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a mobile device 2, a small cell base station 3, and a stationary wireless device 4.

The illustrated communication network 10 of FIG. 1 supports communications using a variety of technologies, including, for example, 4G LTE, 5G NR, and wireless local area network (WLAN), such as Wi-Fi. In the communication network 10, dual connectivity can be implemented with concurrent 4G LTE and 5G NR communication with the mobile device 2. Although various examples of supported communication technologies are shown, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

The techniques of this disclosure are particularly applicable for FDD communications where different frequencies are used for transmitting and receiving signals.

As shown in FIG. 1, the mobile device 2 communicates with the macro cell base station 1 over a communication link that uses a combination of 4G LTE and 5G NR technologies. The mobile device 2 also communicates with the small cell base station 3. In the illustrated example, the mobile device 2 and small cell base station 3 communicate over a communication link that uses 5G NR, 4G LTE, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

In certain implementations, the mobile device 2 communicates with the macro cell base station 1 and the small cell base station 3 using 5G NR technology over one or more frequency bands that fall within Frequency Range 1 (FR1) and/or over one or more frequency bands that are above FR1. The one or more frequency bands within FR1 can be less than 6 GHz. For example, wireless communications can utilize FR1, Frequency Range 2 (FR2), or a combination thereof. In one embodiment, the mobile device 2 supports a HPUE power class specification.

The illustrated small cell base station 3 also communicates with a stationary wireless device 4. The small cell base station 3 can be used, for example, to provide broadband service using 5G NR technology. In certain implementations, the small cell base station 3 communicates with the stationary wireless device 4 over one or more millimeter wave frequency bands in the frequency range of 30 GHz to 300 GHz and/or upper centimeter wave frequency bands in the frequency range of 24 GHz to 30 GHz.

In certain implementations, the small cell base station 3 communicates with the stationary wireless device 4 using beamforming. For example, beamforming can be used to focus signal strength to overcome path losses, such as high loss associated with communicating over millimeter wave frequencies.

The communication network 10 of FIG. 1 includes the macro cell base station 1 and the small cell base station 3. In certain implementations, the small cell base station 3 can operate with relatively lower power, shorter range, and/or with fewer concurrent users relative to the macro cell base station 1. The small cell base station 3 can also be referred to as a femtocell, a picocell, or a microcell.

Although the communication network 10 is illustrated as including two base stations, the communication network 10 can be implemented to include more or fewer base stations and/or base stations of other types. As shown in FIG. 1, base stations can communicate with one another using wireless communications to provide a wireless backhaul. Additionally or alternatively, base stations can communicate with one another using wired and/or optical links.

The communication network 10 of FIG. 1 is illustrated as including one mobile device and one stationary wireless device. The mobile device 2 and the stationary wireless device 4 illustrate two examples of user devices or user equipment (UE). Although the communication network 10 is illustrated as including two user devices, the communication network 10 can be used to communicate with more or fewer user devices and/or user devices of other types. For example, user devices can include mobile phones, tablets, laptops, IoT devices, wearable electronics, and/or a wide variety of other communications devices.

User devices of the communication network 10 can share available network resources (for instance, available frequency spectrum) in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user device a unique code, space-divisional multiple access (SDMA) in which beamforming is used to provide shared access by spatial division, and non-orthogonal multiple access (NOMA) in which the power domain is used for multiple access. For example, NOMA can be used to serve multiple user devices at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user device. Ultra-reliable low latency communications (uRLLC) refers to technology for communication with very low latency, for instance, less than two milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to eMBB, uRLLC, and/or mMTC.

A peak data rate of a communication link (for instance, between a base station and a user device) depends on a variety of factors. For example, peak data rate can be affected by channel bandwidth, modulation order, number of component carriers, and/or number of antennas used for communications.

For instance, in certain implementations, a data rate of a communication link can be about equal to $M*B*\log_2(1+S/N)$, where M is the number of communication channels, B is the channel bandwidth, and S/N is the signal-to-noise ratio (SNR).

Accordingly, the data rate of a communication link can be increased by increasing the number of communication channels (for instance, transmitting and receiving using multiple antennas), using wider bandwidth (for instance, by aggregating carriers), and/or improving SNR (for instance, by increasing transmit power and/or improving receiver sensitivity).

5G NR communication systems can employ a wide variety of techniques for enhancing the data rate and/or communication performance.

Figure 2A:
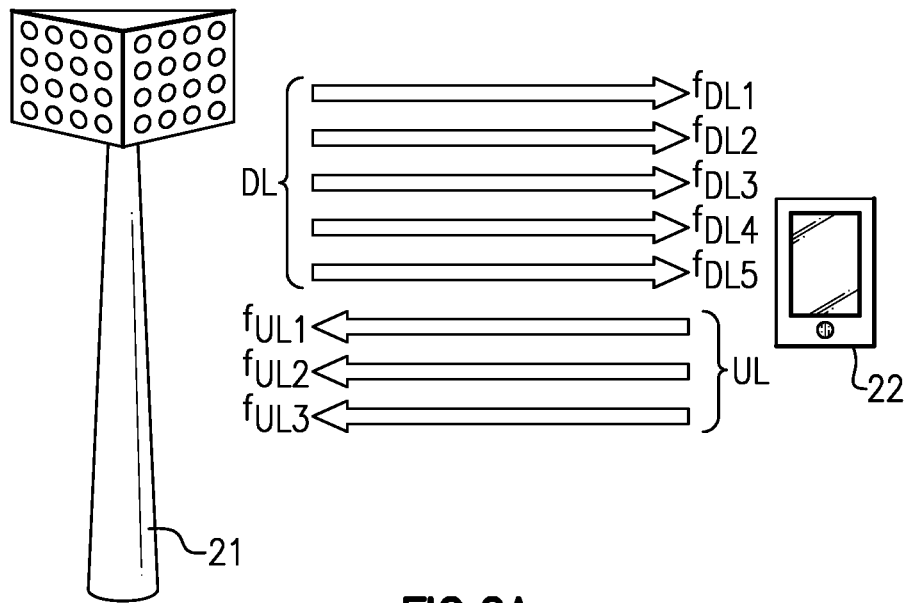
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations. Carrier aggregation can present challenges for harmonic rejection. Filters disclosed herein can be implemented to provide harmonic rejection in carrier aggregation applications. Radio frequency front end architectures disclosed herein can be implemented in dual connectivity applications.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud, for example, via the base station 21.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
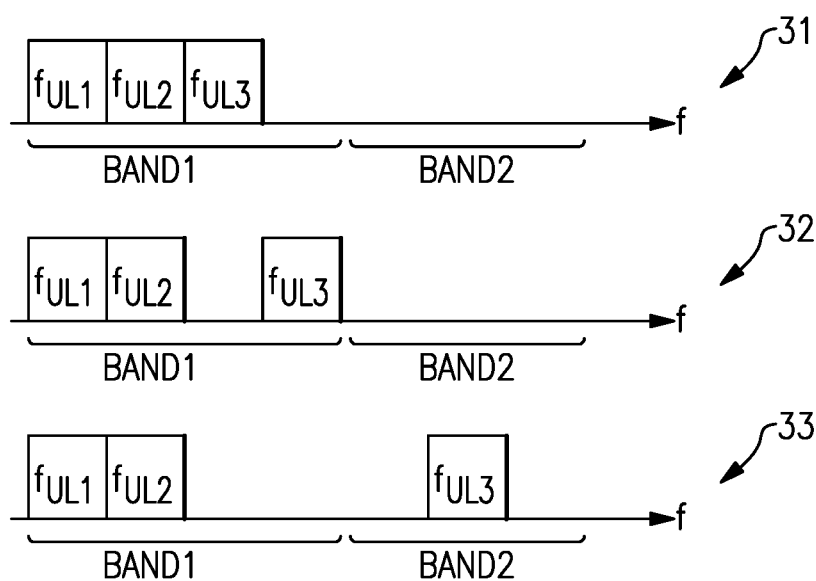
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
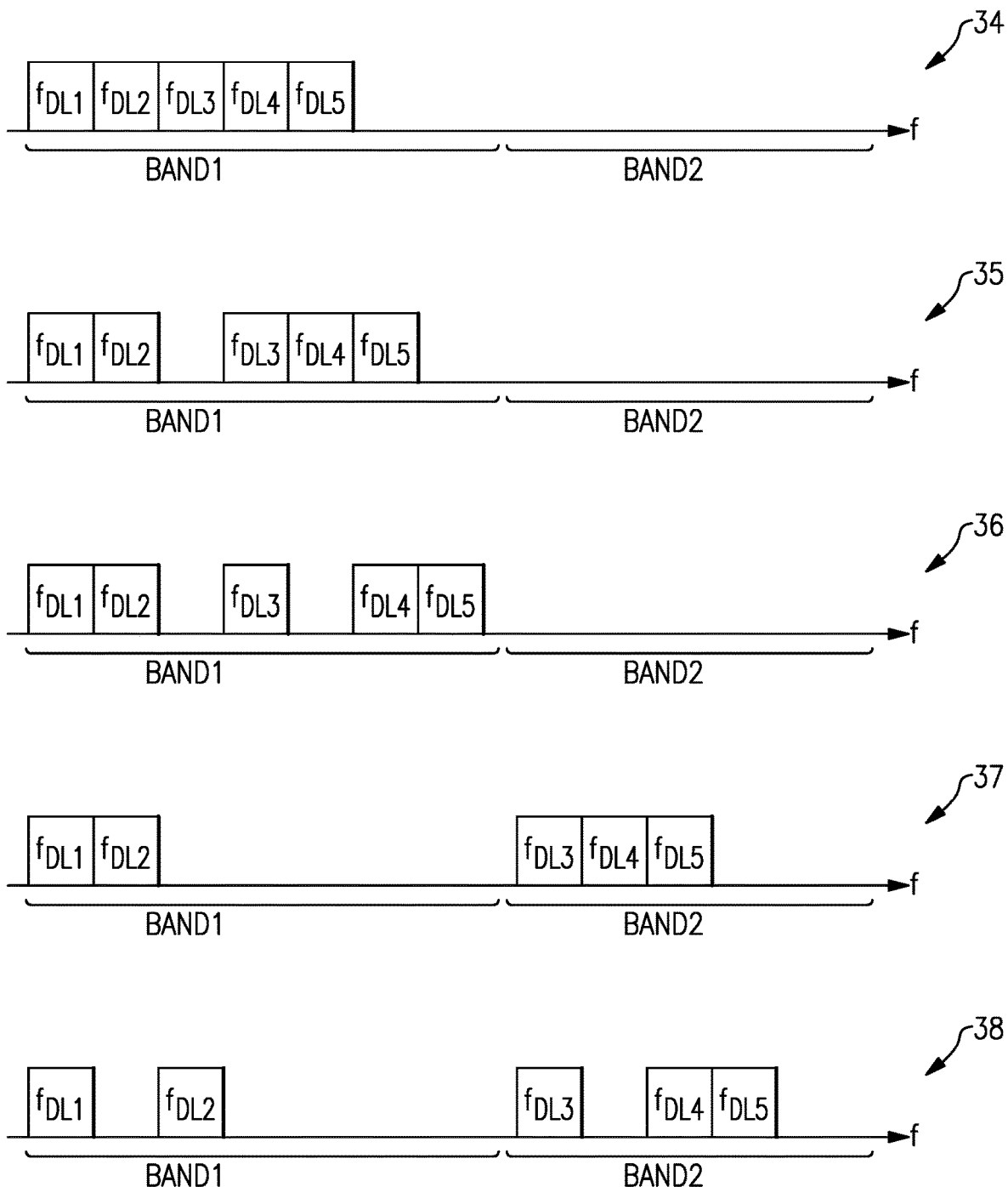
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As the number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as Wi-Fi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid Wi-Fi users and/or to coexist with Wi-Fi users. Enhanced license assisted access (eLAA) refers to an evolution of LAA that aggregates licensed and unlicensed spectrum for both downlink and uplink.

With the introduction of the 5G NR air interface standards, 3GPP has allowed for the simultaneous operation of 5G and 4G standards to facilitate the transition. This mode can be referred to as Non-Stand-Alone (NSA) operation or E-UTRAN New Radio-Dual Connectivity (EN-DC) and involves both 4G and 5G carriers being simultaneously transmitted and/or received from a user equipment (UE). EN-DC can present challenges for harmonic rejection. Filters disclosed herein can be implemented to provide harmonic rejection in dual connectivity applications. Radio frequency front end architectures disclosed herein can be implemented in dual connectivity applications.

In certain EN-DC implementations, dual connectivity NSA involves overlaying 5G systems onto an existing 4G core network. For dual connectivity in such implementations, the control and synchronization between the base station and the UE can be performed by the 4G network while the 5G network is a complementary radio access network tethered to the 4G anchor. The 4G anchor can connect to the existing 4G network with the overlay of 5G data/control.

Figure 3:
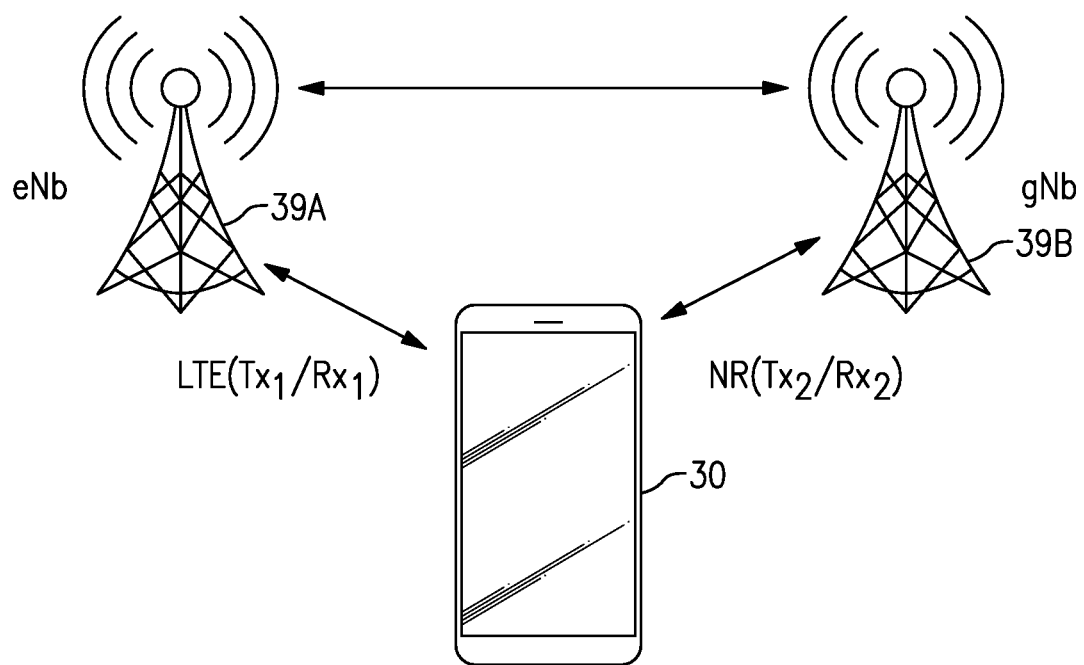
FIG. 3 is a diagram of an example dual connectivity network topology.

FIG. 3 is a diagram of an example dual connectivity network topology. This architecture can leverage LTE legacy coverage to ensure continuity of service delivery and the progressive rollout of 5G cells. A UE 30 can simultaneously transmit dual uplink LTE and NR carriers. The UE 30 can transmit an uplink LTE carrier $Tx_1$ to the eNodeB (eNB) 39A while transmitting an uplink NR carrier $Tx_2$ to the gNodeB (gNB) 39B to implement dual connectivity. Any suitable combination of uplink carriers $Tx_1$, $Tx_2$ and/or downlink carriers $Rx_1$, $Rx_2$ can be concurrently transmitted via wireless links in the example network topology of FIG. 3. The eNB 39A can provide a connection with a core network, such as an Evolved Packet Core (EPC). The gNB 39B can communicate with the core network via the eNB 39A. Control plane data can be wirelessly communicated between the UE 30 and eNB 39A. The eNB 39A can also communicate control plane data with the gNB 39B.

In the example dual connectivity topology of FIG. 3, any suitable combinations of standardized bands and radio access technologies (e.g., FDD, TDD, SUL, SDL) can be wirelessly transmitted and received. This can present technical challenges related to having multiple separate radios and bands functioning in the UE 30. With a TDD LTE anchor point, network operation may be synchronous, in which case the operating modes can be constrained to $Tx_1/Tx_2$ and $Rx_1/Rx_2$, or asynchronous which can involve $Tx_1/Tx_2$, $Tx_1/Rx_2$, $Rx_1/Tx_2$, or $Rx_1/Rx_2$. When the LTE anchor is a frequency division duplex (FDD) carrier, the TDD/FDD inter-band operation can involve simultaneous $Tx_1/Rx_1/Tx_2$ and $Tx_1/Rx_1/Rx_2$.

Aspects and embodiments disclosed herein may be applicable for LTE FDD bands and particularly applicable for LTE FDD bands in which the gap between the boundaries of upload and downlink bands is relatively narrow, such as a gap that is less than 20 MHz. For example, aspects and embodiments disclosed herein may be particularly applicable for the following LTE bands B2, B3, B8, B25, and/or B26. Band B2 has an uplink band of 1850 to 1910 MHz and a downlink band of 1930 to 1990 MHz. The frequency gap between the upper limit of the uplink band and the lower limit of the downlink band is 20 MHz. Band B3 has an uplink band of 1710 to 1785 MHz and a downlink band of 1805 to 1880 MHz. The frequency gap between the upper limit of the uplink band and the lower limit of the downlink band is 20 MHz. Band B8 has an uplink band of 880 to 915 MHz and a downlink band of 925 to 960 MHz. The frequency gap between the upper limit of the uplink band and the lower limit of the downlink band is 10 MHz. Band B25 has an uplink band of 1850 to 1915 MHz and a downlink band of 1930 to 1995 MHz. The frequency gap between the upper limit of the uplink band and the lower limit of the downlink band is 15 MHz. Band B26 has an uplink band of 814 to 849 MHz and a downlink band of 859 to 894 MHz. The frequency gap between the upper limit of the uplink band and the lower limit of the downlink band is 10 MHz. For LTE bands such as these, where the frequency gap between uplink and downlink is relatively narrow, it can be difficult to provide an antenna multiplexer or diplexer having a receive filter and a transmit filter where the receive filter provides a high degree of rejection of transmission signals, e.g., 55 dB or greater rejection. Aspects and embodiments disclosed herein may provide a receive filter of an antenna multiplexer or diplexer with an advantageous level of rejection of transmission signals.

Figure 4:
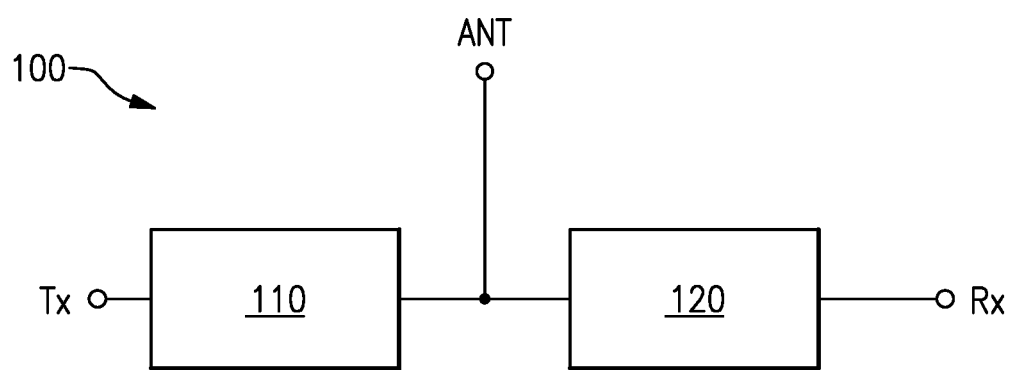
FIG. 4 is a schematic diagram of an antenna multiplexer in which aspects and embodiments disclosed herein may be implemented.

FIG. 4 illustrates an antenna multiplexer 100 in which aspects and embodiments disclosed herein may be implemented. The antenna multiplexer 100 has three ports: an input port, an antenna port, and an output port. The antenna port may be coupled to an antenna. The input port may be coupled to a transmit block configured to provide a transmission signal for output at the antenna port and subsequent transmission on any coupled antenna. The output port may be coupled to a receive block configured to receive a signal from the antenna port. A transmit filter 110 is coupled between the input port and the antenna port and a receive filter 120 is coupled between the antenna port and the output port. The transmit filter 110 is configured to filter a signal received at the antenna port and attenuate such a signal to reduce or mitigate the effect of such a signal at the input port. The receive filter 120 is configured to filter a signal from the input port received at the antenna port and attenuate such a signal to reduce or mitigate the effect of such a signal at the output port.

In some embodiments according to aspects and embodiments disclosed herein, the receive filter 120 of the antenna multiplexer 100 includes a first plurality of acoustic wave resonators in a series path between the common port and the output port and a second plurality of acoustic wave resonators that are each coupled between the series path and ground, wherein none of the second plurality of acoustic wave resonators are directly coupled to the output port and the first plurality of acoustic wave resonators includes a compensation resonator that is coupled to the output port and has a capacitance that is relatively small compared with capacitances of other acoustic resonators of the receive filter 120.

In some embodiments, the capacitance of the compensation resonator is smaller than an average of the capacitances of the first plurality of acoustic wave resonators and may be smaller than 10%, 20%, 30%, 40%, 50%, 60%, 70%, 80%, or 90% of the average of the capacitances of the first plurality of acoustic wave resonators, wherein the average may be one of an arithmetic mean, a geometric mean, or a median.

In some embodiments the capacitance of the compensation resonator is smaller than an average of the capacitances of the first and second pluralities of acoustic wave resonators and may be smaller than 10%, 20%, 30%, 40%, 50%, 60%, 70%, 80%, or 90% of the average of the capacitances of the first and second pluralities plurality of acoustic wave resonators, wherein the average may be one of an arithmetic mean, a geometric mean, or a median.

In some embodiments the capacitance of the compensation resonator is smaller than an average of the capacitances of all of the acoustic wave resonators of the receive filter 120 and may be smaller than 10%, 20%, 30%, 40%, 50%, 60%, 70%, 80%, or 90% of the average of the capacitances of all of the acoustic wave resonators of the receive filter 120, wherein the average may be one of an arithmetic mean, a geometric mean, or a median.

In some embodiments the capacitance of the compensation resonator is a smallest capacitance of the capacitances of the first plurality of acoustic wave resonators.

In some embodiments the capacitance of the compensation resonator is a smallest capacitance of the capacitances of the first and second pluralities of acoustic wave resonators.

In some embodiments the capacitance of the compensation resonator is a smallest capacitance of the capacitances of all acoustic wave resonators in the receive filter 120.

Figure 5:
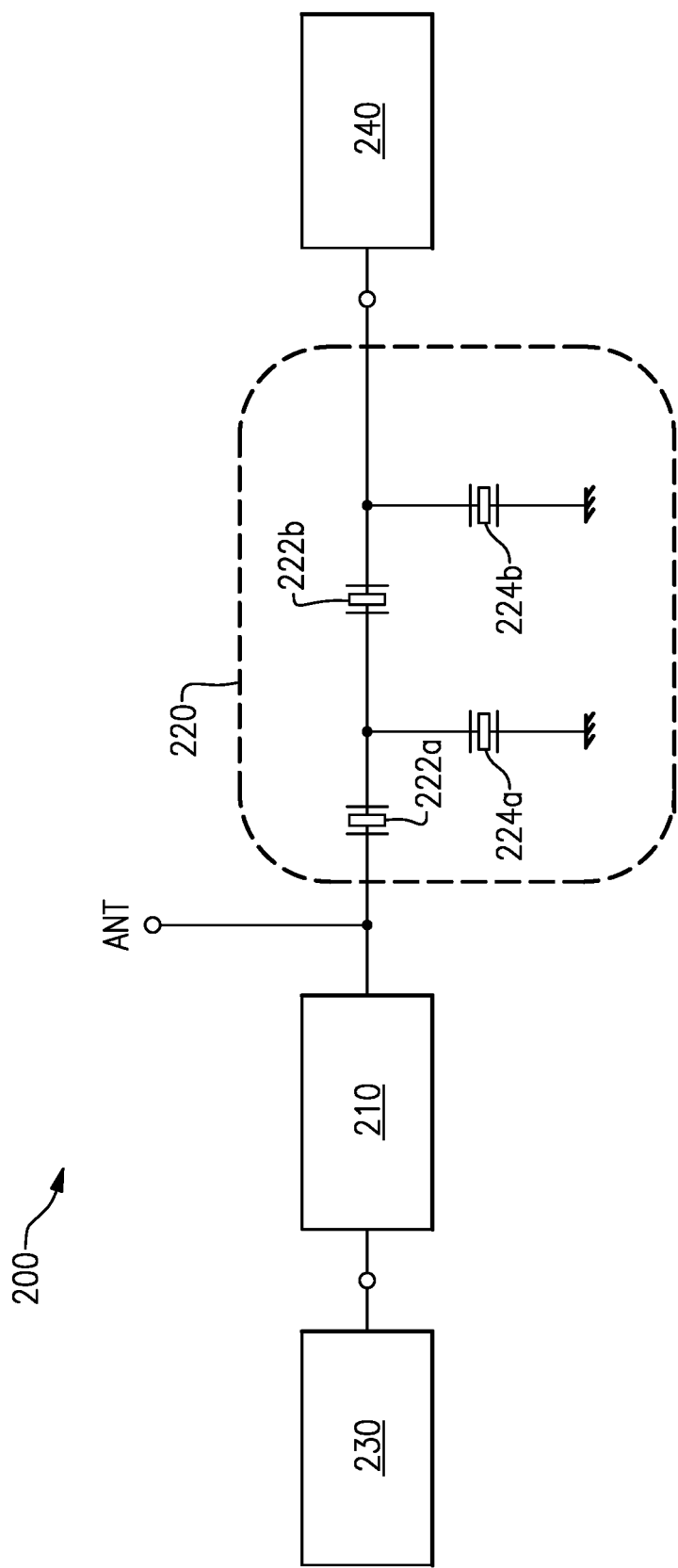
FIG. 5 is a schematic diagram of a circuit including an antenna multiplexer.

FIG. 5 illustrates a circuit including an antenna multiplexer 200 that has three ports: an input port, an antenna port, and an output port. The antenna port may be coupled to an antenna. The input port is coupled to a transmit block 230 configured to provide a transmission signal for output at the antenna port and subsequent transmission on any coupled antenna. The output port is coupled to a receive block 240 configured to receive a signal from the antenna port. A transmit filter 210 is coupled between the input port and the antenna port and a receive filter 220 is coupled between the antenna port and the output port. The transmit filter 210 is configured to filter a signal received at the antenna port and attenuate such a signal to reduce or mitigate the effect of such a signal at the input port. The receive filter 220 is configured to filter a signal from the input port received at the antenna port and attenuate such a signal to reduce or mitigate the effect of such a signal at the output port. The antenna multiplexer 200 may be considered a diplexer. The receive filter includes a two series acoustic wave resonators 222a, 222b connected in series between the antenna port and the output port and two shunt acoustic wave resonators 224a, 224b arranged in a shunt configuration. A first of the shunt acoustic wave resonators 224a is coupled between ground and a node between the two series acoustic wave resonators 222a, 222b. A second of the shunt acoustic wave resonators 224b is coupled between the output port and ground.

Figure 6:
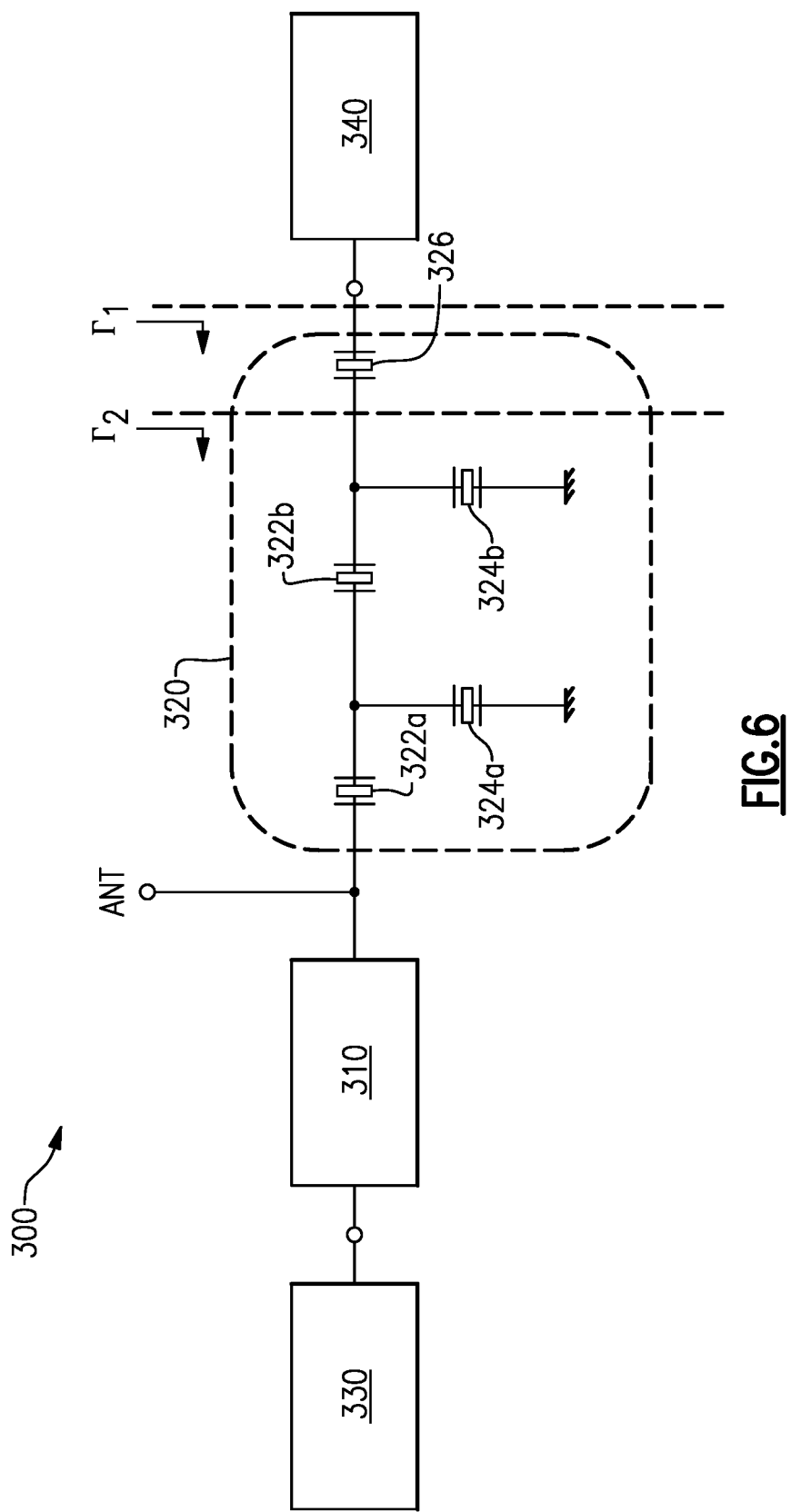
FIG. 6 is a schematic diagram of a circuit including an antenna multiplexer in accordance with aspects and embodiments disclosed herein.

FIG. 6 illustrates a circuit including an antenna multiplexer 300 according to aspects and embodiments disclosed herein. The antenna multiplexer 300 has three ports: an input port, an antenna port, and an output port. The antenna port may be coupled to an antenna. The input port is coupled to a transmit block 330 configured to provide a transmission signal for output at the antenna port and subsequent transmission on any coupled antenna. The output port is coupled to a receive block 340 configured to receive a signal from the antenna port. A transmit filter 310 is coupled between the input port and the antenna port and a receive filter 320 is coupled between the antenna port and the output port. The transmit filter 310 is configured to filter a signal received at the antenna port and attenuate such a signal to reduce or mitigate the effect of such a signal at the input port. The receive filter 320 is configured to filter a signal from the input port received at the antenna port and attenuate such a signal to reduce or mitigate the effect of such a signal at the output port. The antenna multiplexer 300 may be considered a diplexer.

The receive filter 320 includes three series acoustic wave resonators 322a, 322b, and 326 connected in series between the antenna port and the output port, including first and second series acoustic wave resonators 322a, 322b and a third series acoustic wave resonator 326. The third series acoustic wave resonator 326 is a compensation resonator. The third series acoustic wave resonator 326 is the acoustic wave resonator of the three series acoustic resonators that is electrically closest to the output port.

The receive filter 320 further includes two shunt acoustic wave resonators 324a, 324b arranged in a shunt configuration. A first shunt acoustic wave resonator 324a of the shunt acoustic wave resonators is coupled between ground and a node between a first adjacent pair of the three series acoustic wave resonators 322a, 322b. A second shunt acoustic wave resonator 324b of the shunt acoustic wave resonators is coupled between ground and a node between a second adjacent pair of the three series acoustic wave resonators, i.e., between ground and a node between the second series acoustic wave resonator 322b and the third series acoustic wave resonator 326. The third series acoustic wave resonator 326 is coupled to the output port and none of the shunt acoustic wave resonators is coupled to the output port.

In terms of topology, the receive filter 320 of FIG. 6 differs from the receive filter 220 of FIG. 5 in that the third series acoustic wave resonator 326 is directly connected to the output port in the series coupling between antenna port and output port. The second shunt acoustic wave resonator 324b is not coupled between ground and the output port but instead coupled between ground and a node between the second and third series acoustic wave resonators 322b, 326.

The presence of the third series acoustic wave resonator 326 in the configuration shown in FIG. 6 causes a shift in the angular range of a reflection coefficient measured looking into the receive filter 320 from the output port at a frequency range of a transmission signal generated in the transmit block 330 and filtered by the transmit filter 310 for transmission via the antenna, such that the angular range might not overlap with the angular range of a reflection coefficient measured looking into the receive block 340 in the same frequency range, leading to improved isolation of transmit signals at the receive block 340. By selecting appropriate properties for the third series acoustic wave resonator 326, the shift in angular range can be controlled to reduce or avoid overlap, with a smaller acoustic wave resonator likely to give a larger shift in the angular range and so provide better isolation between the input and output ports at the frequency range of the transmission signal.

FIG. 6 additionally shows two dashed vertical lines representing two different points in the circuit at which measurements of angles of reflection coefficients are made. The two dashed vertical lines are either side of the third series acoustic wave resonator. A first measurement is made of the angle, $\Gamma_1$, of the reflection coefficient, looking into the receive filter 320 from the output port, i.e., looking toward the input side of the receive filter. In FIG. 6, this represents the reflection coefficient of the dashed line on the output side of the third series acoustic wave resonator 326. The angle $\Gamma_1$ is measured at a frequency within the frequency range of the transmission signal. A second measurement is made of the angle, $\Gamma_2$, of the reflection coefficient, looking into the receive filter 320 (i.e., toward the input side) at the second dashed line that is on the input side of the third series acoustic wave resonator 326. The angle $\Gamma_2$ is measured at the same frequency within the frequency range of the transmission signal. The difference between $\Gamma_1$ and $\Gamma_2$ is due to the third series acoustic wave resonator 326 in this configuration, which effects an angular change on the reflection coefficient such as an anticlockwise rotation when plotted on a Smith chart. The angular change may be sufficient to provide improved separation between the reflection coefficient at the output port of the receive filter 320 (looking into the receive filter 320) over the frequency range of the transmission signal and the conjugate of a reflection coefficient of the receive block 340 (such as a reflection coefficient of a low noise amplifier within the receive block) looking into the receive block 340, and so provide improved isolation.

Figure 7:
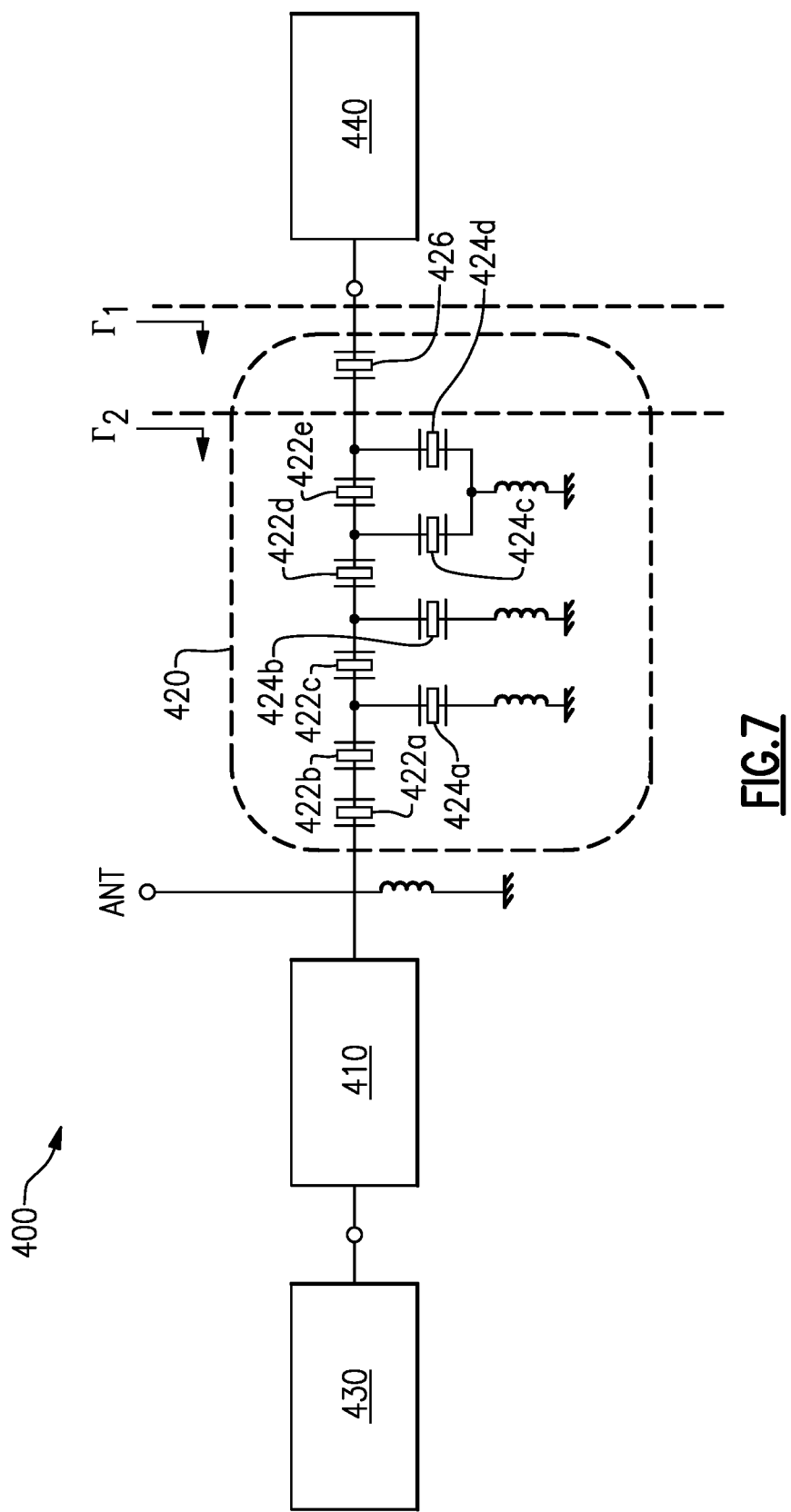
FIG. 7 is a schematic diagram of a circuit including an antenna multiplexer in accordance with aspects and embodiments disclosed herein.

FIG. 7 illustrates a circuit including an antenna multiplexer 400 according to aspects and embodiments disclosed herein. The circuit includes transmit block 430, transmit filter 410, and receive block 440 as per the circuit illustrated in FIG. 6. The transmit block 430 is coupled to the input port and the receive block 440 is coupled to the output port. An antenna may be coupled to the antenna port. The receive filter 420 shown in FIG. 7 is different from the receive filter 320 of FIG. 6.

In particular, the receive filter 420 of FIG. 6 includes six series acoustic wave resonators coupled in series between the antenna port and the output port, including a first series acoustic wave resonator 422a, of which a first end is coupled directly to the antenna port, a second series acoustic wave resonator 422b, of which a first end is coupled directly to a second end of the first series acoustic wave resonator 422a, a third series acoustic wave resonator 422c, of which a first end is coupled directly to a second end of the second series acoustic wave resonator 422b, a fourth series acoustic wave resonator 422d, of which a first end is coupled directly to a second end of the third series acoustic wave resonator 422c, a fifth series acoustic wave resonator 422e, of which a first end is coupled directly to a second end of the fourth series acoustic wave resonator 422d, and a sixth series acoustic wave resonator 426, of which a first end is coupled directly to a second end of the fifth series acoustic wave resonator 422d and a second end is coupled directly to the output port. The sixth series acoustic wave resonator 426 is a compensation resonator.

The receive filter 420 of FIG. 7 further includes first, second, third and fourth shunt acoustic wave resonators 424a, 424b, 424c, 424d. A first shunt acoustic wave resonator 424a is coupled in series between ground and a node located between the second and third series acoustic wave resonators 422b, 422c, with an inductor located in series between the first shunt acoustic wave resonator 424a and ground. A second shunt acoustic wave resonator 424b is coupled in series between ground and a node located between the third and fourth series acoustic wave resonators 422c, 422d, with an inductor located in series between the second shunt acoustic wave resonator 424b and ground. A third shunt acoustic wave resonator 424c is coupled in series between ground and a node located between the fourth and fifth series acoustic wave resonators 422d, 422e. A fourth shunt acoustic wave resonator 424d is coupled in series between ground and a node located between the fifth and sixth series acoustic wave resonators 422e, 426. The third and fourth shunt acoustic wave resonators 424c, 424d are both coupled to ground via a common inductor. In an addition, an inductor is coupled between the antenna port and ground. None of the shunt acoustic wave resonators is coupled to the output port.

The presence of the sixth series acoustic wave resonator 426 in the configuration shown in FIG. 7 causes a shift in the angular range of a reflection coefficient measured looking into the receive filter 420 from the output port at a frequency range of a transmission signal generated in the transit block 430 and filtered by the transmit filter 410 for transmission via the antenna, such that the angular range might not overlap with the angular range of a reflection coefficient measured looking into the receive block 440 in the same frequency range, leading to improved isolation of transmit signals at the receive block 440. By selecting appropriate properties for the sixth series acoustic wave resonator 426, the shift in angular range can be controlled to reduce or avoid overlap, with a smaller acoustic wave resonator likely to give a larger shift in the angular range and so provide better isolation between the input and output ports at the frequency range of the transmission signal.

FIG. 7 additionally shows two dashed vertical lines representing two different points in the circuit at which measurements of angles of reflection coefficients are made. The two dashed vertical lines are either side of the third series acoustic wave resonator. A first measurement is made of the angle, $\Gamma_1$, of the reflection coefficient, looking into the receive filter 420 from the output port, i.e., looking toward the input side of the receive filter. In FIG. 7, this represents the reflection coefficient of the dashed line on the output side of the third series acoustic wave resonator 426. The angle $\Gamma_1$ is measured at a frequency within the frequency range of the transmission signal. A second measurement is made of the angle, $\Gamma_2$, of the reflection coefficient, looking into the receive filter 420 (i.e., toward the input side) at the second dashed line that is on the input side of the sixth series acoustic wave resonator 426. The angle $\Gamma_2$ is measured at the same frequency within the frequency range of the transmission signal. The difference between $\Gamma_1$ and $\Gamma_2$ is due to the sixth series acoustic wave resonator 426 in this configuration, which effects an angular change on the reflection coefficient such as an anticlockwise rotation when plotted on a Smith chart. The angular change may be sufficient to provide improved separation between the reflection coefficient at the output port of the receive filter 420 (looking into the receive filter 420) over the frequency range of the transmission signal and the conjugate of a reflection coefficient of the receive block 440 (such as a reflection coefficient of a low noise amplifier within the receive block) looking into the receive block 440, and so provides improved isolation.

Figure 8:
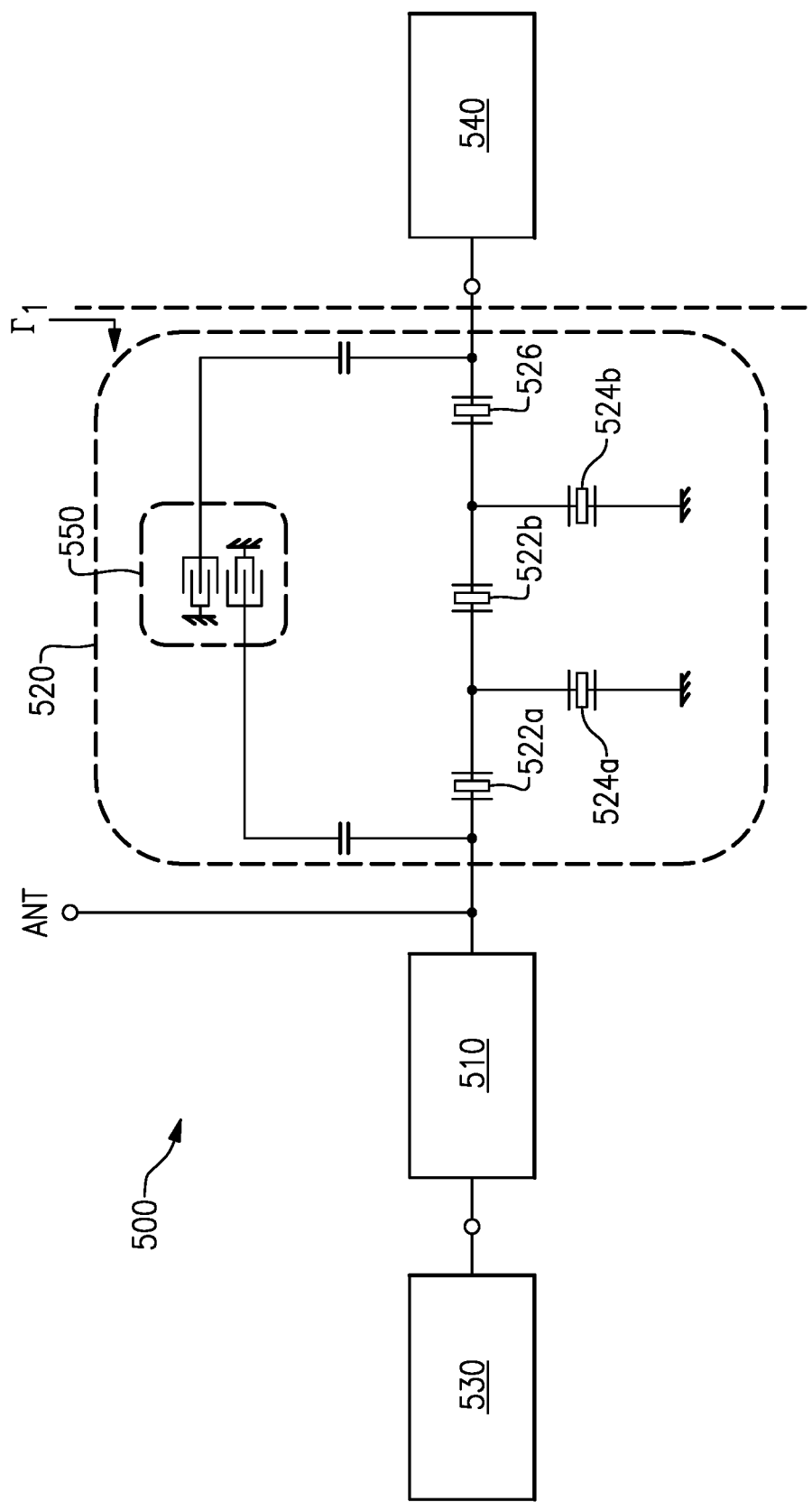
FIG. 8 is a schematic diagram of a circuit including an antenna multiplexer in accordance with aspects and embodiments disclosed herein.

FIG. 8 illustrates a circuit including an antenna multiplexer 500 according to aspects and embodiments disclosed herein. The circuit includes transmit block 530, transmit filter 510, and receive block 540 as per the circuit illustrated in FIG. 6. The transmit block 530 is coupled to the input port and the receive block 540 is coupled to the output port. An antenna may be coupled to the antenna port. The receive filter 520 shown in FIG. 8 is different from the receive filter 320 of FIG. 6.

In particular, the receive filter 520 of FIG. 8 includes three series acoustic wave resonators coupled in series between the antenna port and the output port, including a first series acoustic wave resonator 522a, of which a first end is coupled directly to the antenna port, a second series acoustic wave resonator 522b, of which a first end is coupled directly to a second end of the first series acoustic wave resonator 522a, and a third series acoustic wave resonator 526, of which a first end is coupled directly to a second end of the second series acoustic wave resonator 522b and a second end is coupled directly to the output port.

The receive filter 520 of FIG. 8 further includes first and second shunt acoustic wave resonators 524a, 524b. A first shunt acoustic wave resonator 524a is coupled in series between ground and a node located between the first and second series acoustic wave resonators 522a, 522b. A second shunt acoustic wave resonator 524b is coupled in series between ground and a node located between the second and third series acoustic wave resonators 522b, 526. The third series acoustic wave resonator 526 is a compensation resonator. None of the shunt acoustic wave resonators is coupled to the output port.

The presence of the third series acoustic wave resonator 526 in the configuration shown in FIG. 8 causes a shift in the angular range of a reflection coefficient measured looking into the receive filter 520 from the output port at a frequency range of a transmission signal generated in the transit block 530 and filtered by the transmit filter 510 for transmission via the antenna, such that the angular range might not overlap with the angular range of a reflection coefficient measured looking into the receive block 540 in the same frequency range, leading to improved isolation of transmit signals at the receive block 540. By selecting appropriate properties for the third series acoustic wave resonator 526, the shift in angular range can be controlled to reduce or avoid overlap, with a smaller acoustic wave resonator likely to give a larger shift in the angular range and so provide better isolation between the input and output ports at the frequency range of the transmission signal. The receive filter 520 of FIG. 8 further includes an additional loop between the antenna port and the output port. The additional loop includes a pair of capacitors in series and, in between the capacitors, an acoustic wave filter 550 that includes a first acoustic wave element and a second acoustic wave element, the first and second acoustic wave elements each having a signal electrode and a ground electrode and being arranged such that a direction from the signal electrode to the ground electrode is oriented the same in each of the first and second acoustic wave elements. The acoustic wave filter may be, for example, a surface acoustic wave (SAW) filter or a bulk acoustic wave (BAW) filter such as a film bulk acoustic resonator (FBAR) or a solidly mounted resonator. The acoustic wave filter 550 may be a longitudinally-coupled SAW filter. The additional loop may attenuate a portion of a signal in a stopband of the receive filter 520 by signal phase cancellation.

FIG. 8 additionally shows a dashed vertical line representing a different point in the circuit at which a measurement of an angle of a reflection coefficient is made. The dashed vertical line is on the output side of the third series acoustic wave resonator 526, or equivalently at the output port. A measurement is made of the angle, $\Gamma_1$, of the reflection coefficient, looking into the receive filter 420 from the output port, i.e., looking toward the input side of the receive filter via the series acoustic wave resonators 522a, 522b, 526 and via the additional loop including the acoustic wave filter 550. The angle $\Gamma_1$ is measured at a frequency within the frequency range of the transmission signal. The third series acoustic wave resonator 526 causes a rotation of the reflection coefficient in the frequency range of the transmission signal relative to a circuit in which the third series acoustic wave resonator 526 is omitted, which may reduce or avoid overlap with a conjugate of a reflection coefficient of the receive block 540 and any low noise amplifier located within the receive block over the same frequency range.

The loop is not required to be connected between the antenna port and the output port but may be connected between any two points in the series connection between antenna port and output port, including the antenna port and output port. In some embodiments, multiple loops are included, each having an acoustic wave filter comprising a pair of acoustic wave elements such as a longitudinally coupled SAW filter as per the acoustic wave filter 550 of FIG. 8, each end of the acoustic wave filter coupled to a point in the series connection between antenna port and output port by way of a respective capacitor.

Circuits according to aspects and embodiments disclosed herein may include loop circuits for phase cancellation such as any of the loop circuits for phase cancellation described in US patent application published as US 2018/0152191 A1 of Niwa et al., the contents of which are hereby incorporated by reference into the present disclosure.

Figure 9:
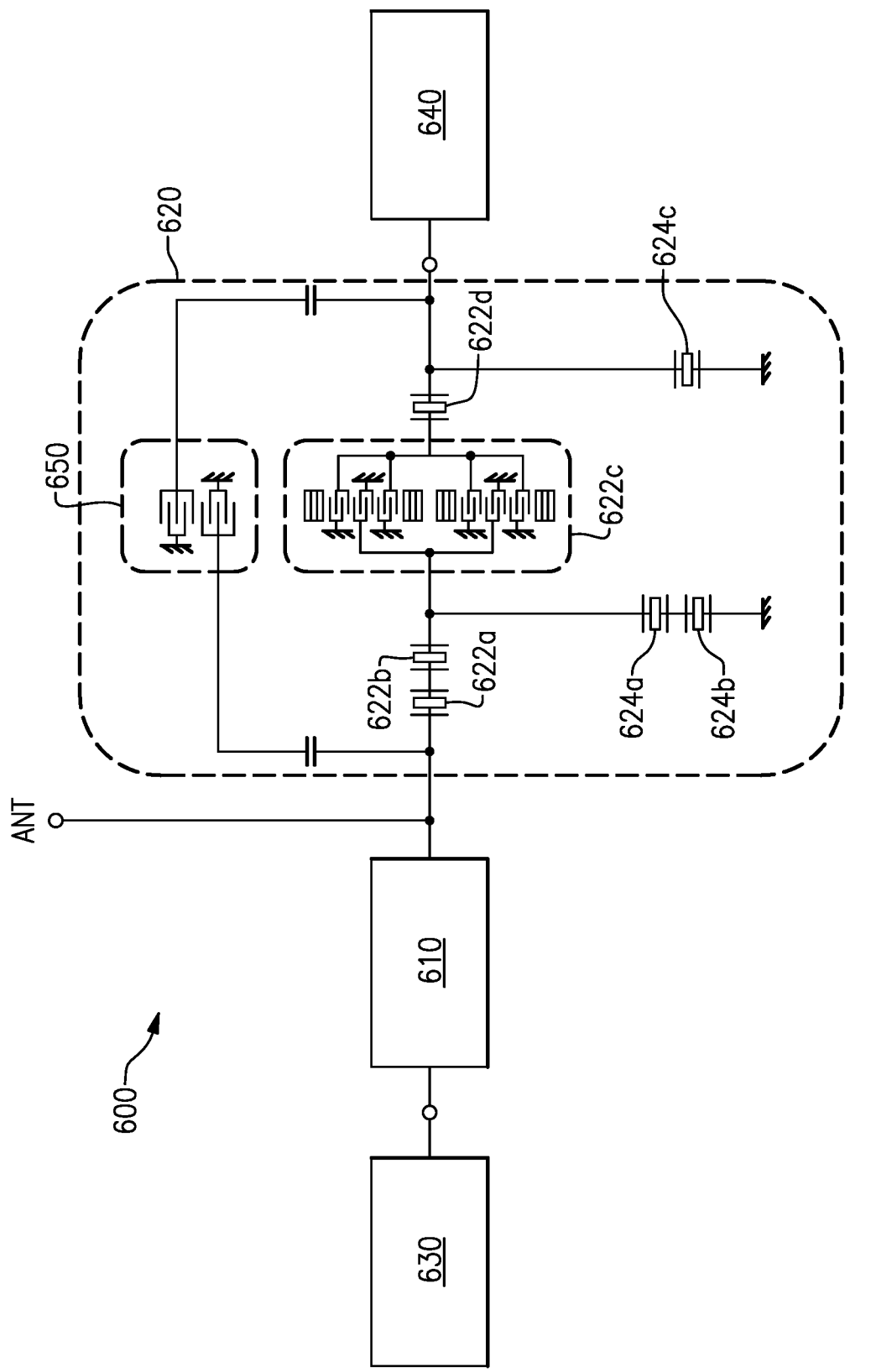
FIG. 9 is a schematic diagram of a circuit including an antenna multiplexer.

FIG. 9 illustrates a circuit including an antenna multiplexer 600 that is not according to aspects and embodiments disclosed herein. The circuit includes transmit block 630, transmit filter 610, and receive block 640 as per the circuit illustrated in FIG. 6. The transmit block 630 is coupled to the input port and the receive block 640 is coupled to the output port. An antenna may be coupled to the antenna port. The receive filter 620 shown in FIG. 9 is different from the receive filter 320 of FIG. 6.

In particular, the receive filter 620 of FIG. 9 includes four series acoustic wave resonators coupled in series between the antenna port and the output port, including a first series acoustic wave resonator 622a, of which a first end is coupled directly to the antenna port, a second series acoustic wave resonator 622b, of which a first end is coupled directly to a second end of the first series acoustic wave resonator 622a, a third series acoustic wave resonator 622c, of which a first end is coupled directly to a second end of the second series acoustic wave resonator 622b, and a fourth series acoustic wave resonator 622d, of which a first end is coupled directly to a second end of the third series acoustic wave resonator 622c and a second end is directly coupled to the output port. The third series acoustic wave resonator 622c is a Double Mode SAW (DMS) resonator.

The receive filter 620 of FIG. 9 further includes first, second, and third shunt acoustic wave resonators 624a, 624b, and 624c. The first and second shunt acoustic wave resonators 624a, 624b are coupled in series between ground and a node located between the second and third series acoustic wave resonators 622b, 622c. The third shunt acoustic wave resonator 624c is coupled in series between ground and the output port.

The receive filter 620 of FIG. 9 further includes an additional loop between the antenna port and the output port. The additional loop includes a pair of capacitors in series and, in between the capacitors, an acoustic wave filter 650 that includes a first acoustic wave element and a second acoustic wave element, the first and second acoustic wave elements each having a signal electrode and a ground electrode and being arranged such that a direction from the signal electrode to the ground electrode is oriented the same in each of the first and second acoustic wave elements. The acoustic wave filter may be, for example, a surface acoustic wave (SAW) filter or a bulk acoustic wave (BAW) filter such as a film bulk acoustic resonator (FBAR) or a solidly mounted resonator. The acoustic wave filter 650 may be a longitudinally-coupled SAW filter. The additional loop may attenuate a portion of a signal in a stopband of the receive filter 620 by signal phase cancellation.

Figure 10:
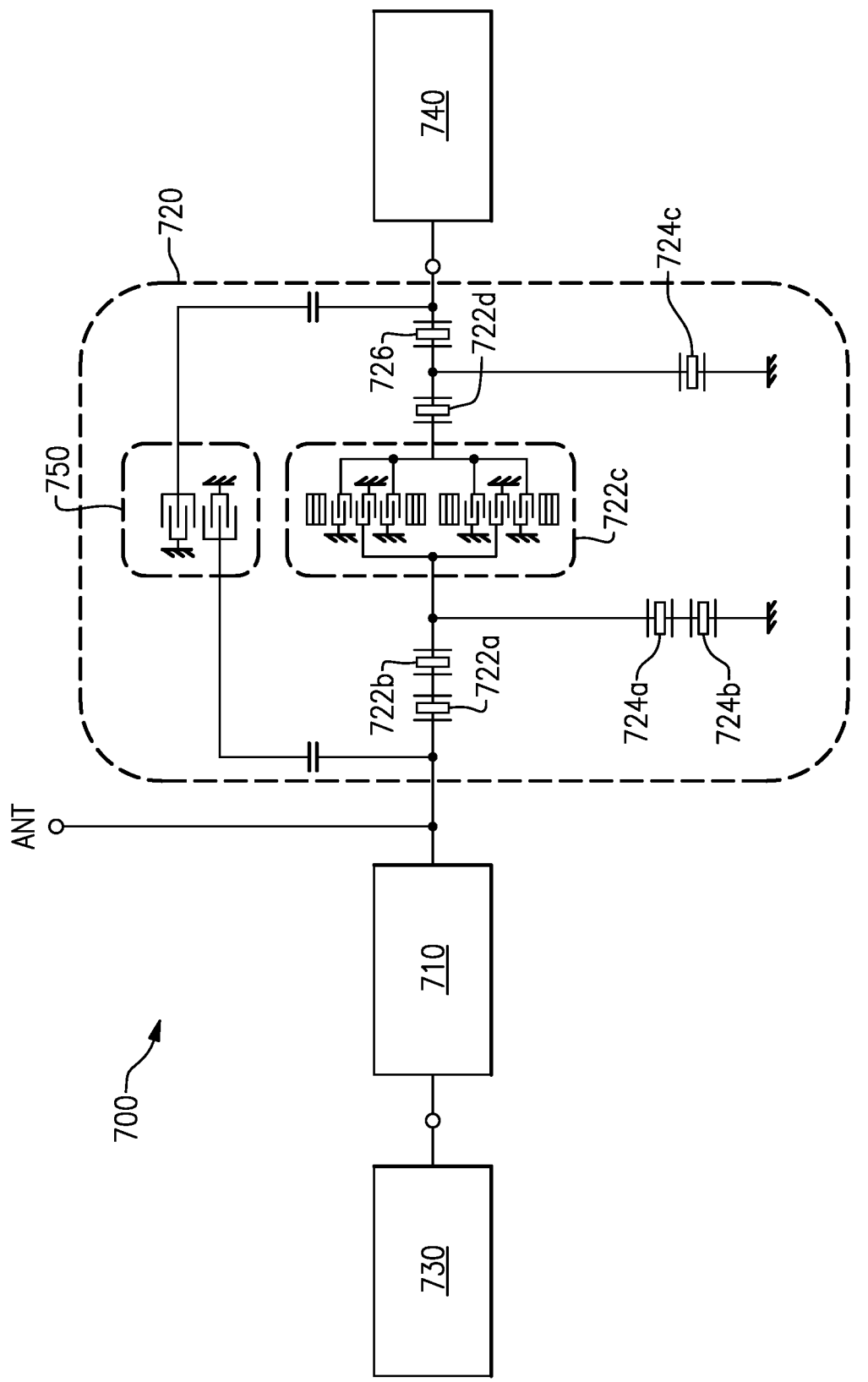
FIG. 10 is a schematic diagram of a circuit including an antenna multiplexer in accordance with aspects and embodiments disclosed herein.

FIG. 10 illustrates a circuit including an antenna multiplexer 700 according to aspects and embodiments disclosed herein. The circuit includes transmit block 730, transmit filter 710, and receive block 740 as per the circuit illustrated in FIG. 9. The transmit block 730 is coupled to the input port and the receive block 740 is coupled to the output port. An antenna may be coupled to the antenna port. The receive filter 720 shown in FIG. 10 is different from the receive filter 620 of FIG. 9 in that it includes an additional series acoustic wave resonator, i.e., a fifth series acoustic wave resonator 726, in the series coupling between the fourth series acoustic wave resonator 722d and the output port. The third shunt acoustic wave resonator 724c is coupled between ground and a node located between the fourth series acoustic wave resonator 724d and the fifth series acoustic wave resonator 726. No shunt acoustic wave resonator is coupled between the output port and ground. An additional loop including an acoustic wave filter 750 and capacitors as per FIG. 9 is coupled between the antenna port and the output port.

FIGS. 11 to 15 show Smith charts plotting reflection coefficients for the circuits of FIGS. 9 and 10, obtained from simulations. As will be discussed below, the addition of a series resonator to the output (Rx) port, where it would be connected to a low noise amplifier input in a receive block, moves the output port transmission frequency contour away from the location of the low noise amplifier input conjugate location on the charts.

Figure 11:
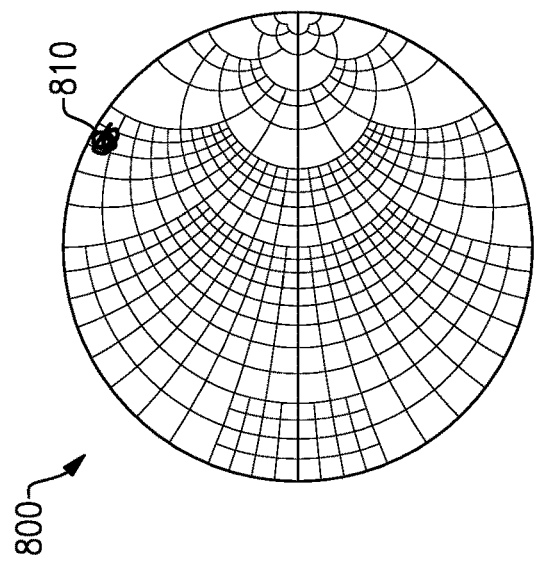
FIG. 11 illustrates a Smith chart showing the conjugate of a reflection coefficient of the input impedance a low noise amplifier (LNA) over the frequency range of a transmission band.

FIG. 11 shows a Smith chart 800 on which the contour 810 of the reflection coefficient of the LNA input conjugate is plotted at a transmission frequency of 1.805 GHz to 1.88 GHz. This is the same contour for the circuits of FIGS. 9 and 10 since these circuits have the same receive blocks.

Figure 12:
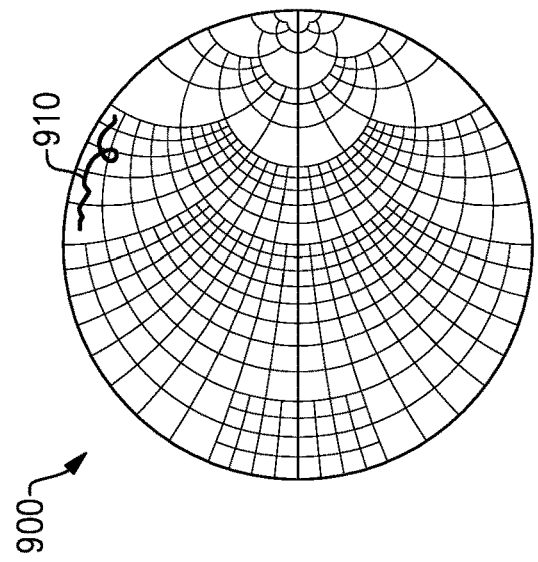
FIG. 12 illustrates a Smith chart showing a reflection coefficient looking into the Rx port of the antenna multiplexer shown in FIG. 9 over the frequency range of a transmission band.

FIG. 12 shows a Smith chart 900 on which the contour 910 of the reflection coefficient of the antenna multiplexer of FIG. 9 is plotted, the reflection coefficient measured looking into the output port of the antenna multiplexer at the same transmission frequency of 1.805 GHz to 1.88 GHz.

Figure 13:
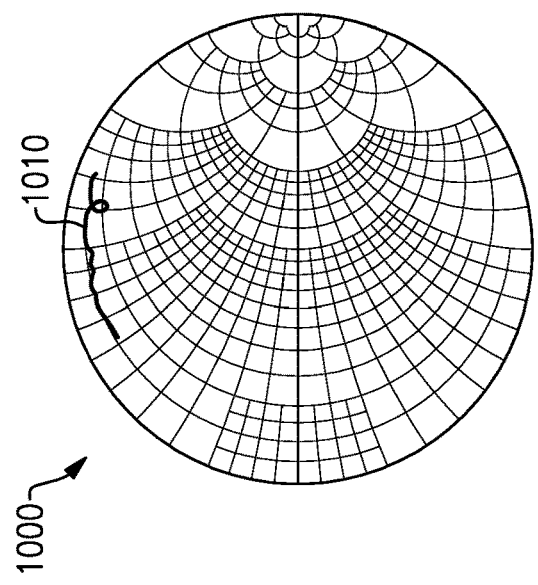
FIG. 13 illustrates a Smith chart showing a reflection coefficient looking into the Rx port of the antenna multiplexer shown in FIG. 10 over the frequency range of a transmission band.

FIG. 13 shows a Smith chart 1000 on which the contour 1010 of the reflection coefficient of the antenna multiplexer of FIG. 10 is plotted, the reflection coefficient measured looking into the output port of the antenna multiplexer at the same transmission frequency of 1.805 GHz to 1.88 GHz. Relative to the contour 910 of FIG. 12, the contour 1010 of FIG. 13 is rotated anticlockwise, the angular shift provided by the presence of the additional series resonator 726 coupled to the output port in the circuit of FIG. 10.

Figure 14:
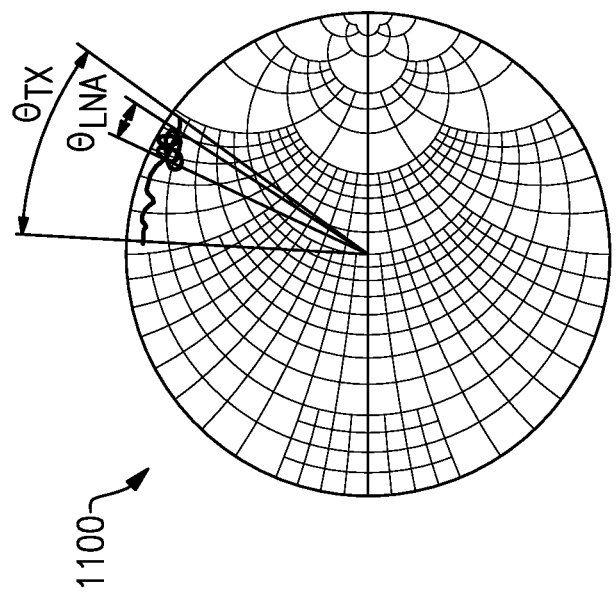
FIG. 14 illustrates a Smith chart comparing the reflection coefficients of FIGS. 11 and. 12.

FIG. 14 shows a Smith chart 1100 in which the contour 910 of FIG. 12 is plotted alongside the contour 810 of FIG. 11. The Smith chart 1100 identifies the angular range of the contour 910 of the reflection coefficient of the antenna multiplexer of FIG. 12 and denotes this angle by $\Theta_{TX}$. The Smith chart 1100 also identifies the angular range of the contour 810 of the reflection coefficient of the LNA input conjugate and denotes this angle by $\Theta_{LNA}$. In this example, the angular range of the contour 910 of reflection coefficient of the antenna multiplexer overlaps with the angular range of the contour of the reflection coefficient of the LNA input conjugate.

Figure 15:
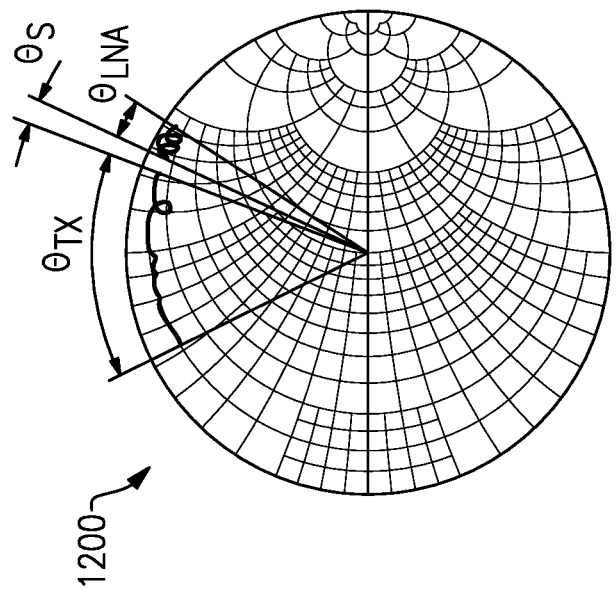
FIG. 15 illustrates a Smith chart comparing the reflection coefficients of FIGS. 11 and 13.

FIG. 15 shows a Smith chart 1200 in which the contour 1010 of FIG. 13 is plotted alongside the contour 810 of FIG. 11. The Smith chart 1200 identifies the angular range of the contour 1010 of the reflection coefficient of the antenna multiplexer of FIG. 10 and denotes this angle by $\Theta_{TX}$. The Smith chart 1200 also identifies the angular range of the contour 810 of the reflection coefficient of the LNA input conjugate and denotes this angle by $\Theta_{LNA}$. In this example, the angular range of the contour 1010 of reflection coefficient of the antenna multiplexer does not overlap with the angular range of the contour of the reflection coefficient of the LNA input conjugate. In fact, in this particular example, the angular range of the contour 1010 is separated from the angular range of the contour 810 by a non-zero angle denoted by $\Theta_S$, which is the minimum angle between the angular range of the contour 1010 and the angular range of the contour 810. Over the frequency range of the transmission signal (1.805 GHz to 1.88 GHz in this example), the contour 1010 of reflection coefficient of the antenna multiplexer of FIG. 10 (looking into the output port of the antenna multiplexer) varies over a first angular range and the contour 810 of the reflection coefficient of the LNA input conjugate (looking into the LNA input) varies over a second angular range that does not overlap at all with the first angular range. These angular ranges are separated by a non-zero angular separation $\Theta_S$, which is the smaller of the angular separations between the angular ranges. As a result of the angular separation between the angular ranges of the reflection coefficients, the LNA is better isolated from the transmission signal in the circuit of FIG. 10 than in the circuit of FIG. 9. This is effect is caused by the series acoustic wave resonator at the output port of the receive filter of the antenna multiplexer that is not present in the circuit of FIG. 9. Due to the omission of the series acoustic wave resonator at the output port of the receive filter in FIG. 9, the contours 810 and 910 of the angular ranges of the reflection coefficients overlap in the Smith chart 1100, which means that the LNA is less well isolated from the transmission signal than in the circuit of FIG. 10.

The circuits disclosed herein can be included in radio frequency systems, such as in a radio frequency front end. A circuit in accordance with any suitable principles and advantages disclosed herein be implemented at any suitable location in a system that could benefit from the isolation provided by an antenna multiplexer or filter circuit in accordance with the aspects and embodiments disclosed herein.

FIG. 16 illustrates a schematic diagram of one example of a front-end module 1300, which may be used in an electronic device such as a wireless communications device (e.g., a mobile phone) for example, and which includes an antenna multiplexer 1305. The antenna multiplexer 1305 has a common port 1306, an input port 1307, and an output port 1308. An antenna 1360 is connected to the common port 1306. In certain examples, a phase matching component 1350, such as an inductor, can be connected to the common port 1306, as shown. The front-end module 1300 further includes a transmitter circuit 1330 connected to the input port 1307 of the antenna multiplexer 1305 and a receiver circuit 1340 connected to the output port 1308 of the antenna multiplexer 1305. The transmitter circuit 1330 can generate signals for transmission via the antenna 1360, and the receiver circuit 1340 can receive and process signals received via the antenna 1360. In some embodiments such reception and transmission functionalities can be implemented in separate components or in a common transceiver circuit/module. As will be appreciated by those skilled in the art, given the benefit of this disclosure, the front-end module 1300 may include other components, not illustrated, such as, but not limited to, switches, electromagnetic couplers, amplifiers, processors, and the like.

The antenna multiplexer 1305 includes one or more transmission filters 1310 connected between the input port 1307 and the common port 1306, and one or more receive filters 1320 connected between the common port 1306 and the output port 1308. The isolation characteristic of the antenna multiplexer 1305 refers to the passing characteristic from the input port 1307 to the output port 1308. An improved isolation characteristic can be obtained in the passbands of the filters 1310 and 1320 by reducing a level of signal that passes between the input port 1307 and the output port 1309. As discussed above, one manner by which this can be achieved is to insure that the receive filter 1320 includes a first plurality of acoustic wave resonators coupled together in series between the common port 1306 and the output port 1308, the receive filter 1320 further includes a second plurality of acoustic wave resonators, each of the second plurality of acoustic wave resonators coupled between ground and a respective node between a pair of acoustic wave resonators of the first plurality of acoustic wave resonators, the first plurality of acoustic wave resonators including a compensation resonator coupled directly to the output port. Through the presence of the compensation resonator, a first angular range that is equal to the angular range of a reflection coefficient of the antenna multiplexer over a transmission frequency band (of signals generated by the transmitter circuit 1330 for transmission via the antenna 1360) measured looking into the output port of the antenna multiplexer does not overlap with a second angular range that is equal to the angular range of the conjugate of the reflection coefficient of a low noise amplifier in the receiver circuit 1340 over the transmission frequency band measured looking into an input of the low noise amplifier.

The circuits disclosed herein can be included in wireless communication devices, such as mobile devices. One or more circuits in accordance with any suitable principles and advantages disclosed herein can be implemented in any suitable wireless communication device, such as a mobile device or base station as described herein in connection with FIGS. 1 to 3. An example of such a wireless communication device will be discussed with reference to FIG. 17.

Figure 17:
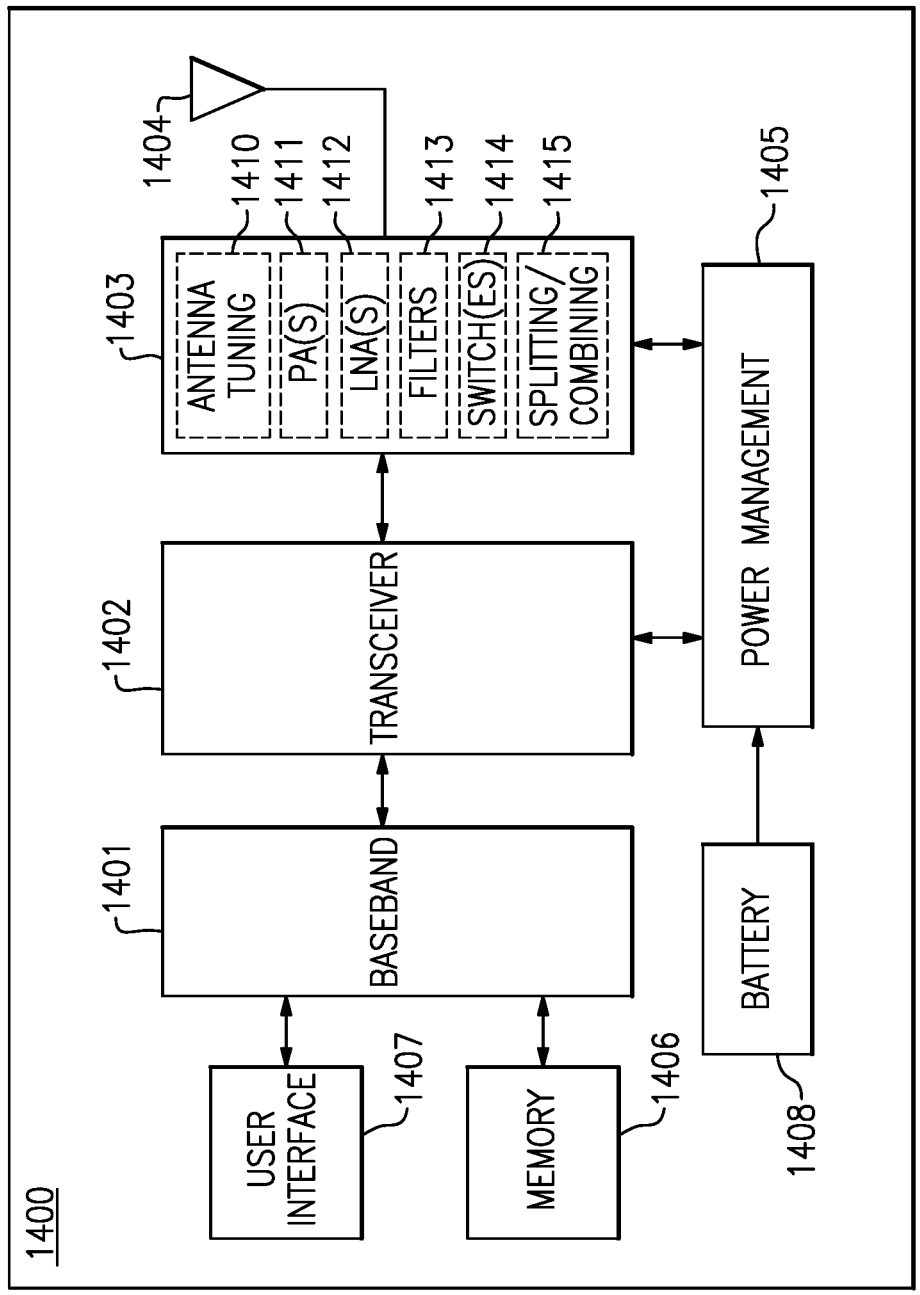
FIG. 17 is a schematic diagram of a mobile device in accordance with aspects and embodiments disclosed herein.

FIG. 17 is a schematic diagram of one embodiment of a mobile device 1400. The mobile device 1400 includes a baseband system 1401, a transceiver 1402, a front end system 1403, antennas 1404, a power management system 1405, a memory 1406, a user interface 1407, and a battery 1408.

The mobile device 1400 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 1402 generates RF signals for transmission and processes incoming RF signals received from the antennas 1404. It will be understood that various functionalities associated with the transmission and receiving of RF signals can be achieved by one or more components that are collectively represented in FIG. 17 as the transceiver 1402. In one example, separate components (for instance, separate circuits or dies) can be provided for handling certain types of RF signals.

The front end system 1403 aids in conditioning signals transmitted to and/or received from the antennas 1404. In the illustrated embodiment, the front end system 1403 includes antenna tuning circuitry 1410, power amplifiers (PAs) 1411, low noise amplifiers (LNAs) 1412, filters 1413, switches 1414, and signal splitting/combining circuitry 1415. However, other implementations are possible. The filters 1413 can include one or more filters of one or more circuits according to aspects and embodiments disclosed herein.

For example, the front end system 1403 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1400 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 1404 can include antennas used for a wide variety of types of communications. For example, the antennas 1404 can include antennas for transmitting and/or receiving signals associated with a wide variety of frequencies and communications standards.

In certain implementations, the antennas 1404 support Multiple Input Multiple Output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1400 can operate with beamforming in certain implementations. For example, the front end system 1403 can include amplifiers having controllable gain and phase shifters having controllable phase to provide beam formation and directivity for transmission and/or reception of signals using the antennas 1404. For example, in the context of signal transmission, the amplitude and phases of the transmit signals provided to the antennas 1404 are controlled such that radiated signals from the antennas 1404 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 1404 from a particular direction. In certain implementations, the antennas 1404 include one or more arrays of antenna elements to enhance beamforming.

The baseband system 1401 is coupled to the user interface 1407 to facilitate processing of various user input and output (I/O), such as voice and data. The baseband system 1401 provides the transceiver 1402 with digital representations of transmit signals, which the transceiver 1402 processes to generate RF signals for transmission. The baseband system 1401 also processes digital representations of received signals provided by the transceiver 1402. As shown in FIG. 17, the baseband system 1401 is coupled to the memory 1406 of facilitate operation of the mobile device 1400.

The memory 1406 can be used for a wide variety of purposes, such as storing data and/or instructions to facilitate the operation of the mobile device 1400 and/or to provide storage of user information.

The power management system 1405 provides a number of power management functions of the mobile device 1400. In certain implementations, the power management system 1405 includes a PA supply control circuit that controls the supply voltages of the power amplifiers 1411. For example, the power management system 1405 can be configured to change the supply voltage(s) provided to one or more of the power amplifiers 1411 to improve efficiency, such as power added efficiency (PAE).

As shown in FIG. 17, the power management system 1405 receives a battery voltage from the battery 1408. The battery 1408 can be any suitable battery for use in the mobile device 1400, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 450 MHz to 14.5 GHz.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An antenna multiplexer comprising:
an input port;
a common port;
an output port;
a transmit filter coupled between the input port and the common port; and
a receive filter coupled between the common port and the output port, the receive filter including a first plurality of acoustic wave resonators in a series path between the common port and the output port and a second plurality of acoustic wave resonators that are each coupled between the series path and ground, none of the second plurality of acoustic wave resonators being directly coupled to the output port, the first plurality of acoustic wave resonators including a compensation resonator that is coupled to the output port and has a capacitance that is less than an average of the capacitances of the first plurality of acoustic wave resonators.

2. The antenna multiplexer of claim 1 wherein the capacitance of the compensation resonator is less than a fraction of the average of the capacitances of the first plurality of acoustic wave resonators and the fraction is one of 10%, 20%, 30%, 40%, 50%, 60%, 70%, 80%, or 90%.

3. The antenna multiplexer of claim 1 wherein the capacitance of the compensation resonator is less than an average of the capacitances of the first and second pluralities of acoustic wave resonators.

4. The antenna multiplexer of claim 3 wherein the capacitance of the compensation resonator is less than a fraction of the average of the capacitances of the first and second pluralities of acoustic wave resonators and the fraction is one of 10%, 20%, 30%, 40%, 50%, 60%, 70%, 80%, or 90%.

5. The antenna multiplexer of claim 1 wherein the capacitance of the compensation resonator is less than an average of the capacitances of all of the acoustic wave resonators of the receive filter.

6. The antenna multiplexer of claim 5 wherein the capacitance of the compensation resonator is less than a fraction of the average of the capacitances of all of the acoustic wave resonators of the receive filter and the fraction is one of 10%, 20%, 30%, 40%, 50%, 60%, 70%, 80%, or 90%.

7. The antenna multiplexer of claim 1 wherein the capacitance of the compensation resonator is a smallest capacitance of the capacitances of the first plurality of acoustic wave resonators.

8. The antenna multiplexer of claim 1 wherein the capacitance of the compensation resonator is a smallest capacitance of the capacitances of the first and second pluralities of acoustic wave resonators.

9. The antenna multiplexer of claim 1 wherein the capacitance of the compensation resonator is a smallest capacitance of the capacitances of all of acoustic wave resonators of the receive filter.

10. The antenna multiplexer of claim 1 wherein there is a node between each pair of neighboring acoustic wave resonators of the first plurality of acoustic wave resonators and the receive filter further includes one or more additional acoustic wave resonators in one or more respective loop paths, each of the one or more respective loop paths coupled between one of two of the nodes, one of the nodes and one of the output port or the common port, or the output port and the common port.

11. The antenna multiplexer of claim 1 wherein one of the first and second pluralities of acoustic wave resonators include one or more of a surface acoustic wave (SAW) resonator, a temperature compensated SAW resonator, a solidly mounted resonator (SMR), a bulk acoustic wave (BAW) resonator, a film bulk acoustic resonator (FBAR), a Lamb wave resonator (LWR), a multilayer piezoelectric substrate (MPS), or a double mode SAW (DMS) filter.

12. The antenna multiplexer of claim 1 wherein the receive filter is one of a band pass filter or a band rejection filter.

13. The antenna multiplexer of claim 1 wherein the antenna multiplexer is a diplexer.

14. The antenna multiplexer of claim 1 wherein none of the second plurality of acoustic wave resonators is directly coupled to the common port.

15. A module comprising:
an antenna multiplexer that includes an input port, a common port, an output port, a transmit filter coupled between the input port and the common port, and a receive filter coupled between the common port and the output port, the receive filter including a first plurality of acoustic wave resonators in a series path between the common port and the output port and a second plurality of acoustic wave resonators that are each coupled between the series path and ground, none of the second plurality of acoustic wave resonators being directly coupled to the output port, the first plurality of acoustic wave resonators including a compensation resonator that is coupled to the output port and has a capacitance that is less than an average of the capacitances of the first plurality of acoustic wave resonators.

16. The module of claim 15 further comprising a transmit block coupled to the input port, the transmit block including a power amplifier.

17. The module of claim 15 further comprising a receive block coupled to the output port, the receive block including a low noise amplifier.

18. An electronic device comprising:
an antenna multiplexer that includes an input port, a common port, an output port, a transmit filter coupled between the input port and the common port, and a receive filter coupled between the common port and the output port, the receive filter including a first plurality of acoustic wave resonators in a series path between the common port and the output port and a second plurality of acoustic wave resonators that are each coupled between the series path and ground, none of the second plurality of acoustic wave resonators being directly coupled to the output port, the first plurality of acoustic wave resonators including a compensation resonator that is coupled to the output port and has a capacitance that is less than an average of the capacitances of the first plurality of acoustic wave resonators.

19. The electronic device of claim 18 further comprising an antenna coupled to the common port.

20. The electronic device of claim 18 further comprising a transmit block coupled to the input port, the transmit block including a power amplifier, and a receive block coupled to the output port, the receive block including a low noise amplifier.

* * * * *